United States Patent
Lee

(10) Patent No.: US 10,553,653 B2
(45) Date of Patent: Feb. 4, 2020

(54) DISPLAY PANEL AND DISPLAY APPARATUS HAVING THE SAME

(71) Applicant: SAMSUNG ELECTRONICS CO., LTD., Suwon-si (KR)

(72) Inventor: Kye Hoon Lee, Yongin-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/137,869

(22) Filed: Sep. 21, 2018

(65) Prior Publication Data
US 2019/0096960 A1 Mar. 28, 2019

(30) Foreign Application Priority Data
Sep. 22, 2017 (KR) .................. 10-2017-0122464

(51) Int. Cl.
| | |
|---|---|
| *H01L 33/00* | (2010.01) |
| *H01L 27/32* | (2006.01) |
| *H01L 27/12* | (2006.01) |
| *H01L 51/50* | (2006.01) |
| *H01L 51/52* | (2006.01) |

(52) U.S. Cl.
CPC ........ *H01L 27/3213* (2013.01); *H01L 27/124* (2013.01); *H01L 27/322* (2013.01); *H01L 51/502* (2013.01); *H01L 51/5203* (2013.01)

(58) Field of Classification Search
CPC . H01L 33/08; H01L 27/3206; H01L 27/3213; H01L 27/322; H01L 27/3225; H01L 27/3274; H01L 27/326; H01L 27/3262
See application file for complete search history.

(56) References Cited

U.S. PATENT DOCUMENTS

2006/0238120 A1* 10/2006 Miller .................. C09K 11/06
313/506
2012/0025699 A1 2/2012 Okumoto et al.
(Continued)

FOREIGN PATENT DOCUMENTS

| EP | 3236502 A1 | 10/2017 |
|---|---|---|
| WO | 2016098954 A1 | 6/2016 |

OTHER PUBLICATIONS

Communication dated Oct. 30, 2018, from the European Patent Office in counterpart European Application No. 18195618.6.
(Continued)

*Primary Examiner* — Hsien Ming Lee
(74) *Attorney, Agent, or Firm* — Sughrue Mion, PLLC

(57) ABSTRACT

The display panel may include a light source which includes a red subpixel region, a green subpixel region, a blue subpixel region, and at least one white subpixel region; a red pixel electrode configured to supply a current to the red subpixel region; a green pixel electrode configured to supply the current to the green subpixel region; a blue pixel electrode configured to supply the current to the blue subpixel region; and at least one white pixel electrode disposed in at least one from among between the red pixel electrode and the green pixel electrode and between the green pixel electrode and the blue pixel electrode. The at least one white pixel electrode may be configured to supply the current to the at least one white subpixel region.

20 Claims, 21 Drawing Sheets

(56) References Cited

U.S. PATENT DOCUMENTS

| | | | |
|---|---|---|---|
| 2012/0092239 A1* | 4/2012 | Hwang | ............... H01L 27/3213 345/76 |
| 2015/0062192 A1* | 3/2015 | Kim | ..................... G09G 3/3291 345/690 |
| 2016/0351749 A1 | 12/2016 | Coe-Sullivan et al. | |
| 2017/0031205 A1* | 2/2017 | Lee | ................... G02F 1/133502 |
| 2017/0061892 A1 | 3/2017 | Jung et al. | |
| 2017/0125740 A1 | 5/2017 | Lee et al. | |
| 2017/0179438 A1 | 6/2017 | Xu | |

OTHER PUBLICATIONS

Communication dated May 29, 2019 issued by the European Intellectual Property Office in counterpart European Application No. 18195618.6.

Communication dated Feb. 22, 2019, issued by the European Patent Office in counterpart European Application No. 18195618.6.

* cited by examiner

DISPLAY PANEL AND DISPLAY APPARATUS HAVING THE SAME

CROSS-REFERENCE TO RELATED APPLICATION

This application is based on and claims priority under 35 U.S.C. § 119 to Korean Patent Application No. 10-2017-0122464, filed on Sep. 22, 2017, in the Korean Intellectual Property Office, the disclosure of which is incorporated by reference in its entirety.

BACKGROUND

1. Field

The disclosure relates to a display panel which uses a quantum dot for a color filter, and a display apparatus having the same.

2. Description of Related Art

A display apparatus equipped with a display panel for displaying an image may display various formats of image data, such as broadcast signals.

Display panels may be further categorized as either emissive display panels that are self-luminous or non-emissive display panels that require separate light sources. The emissive display panels include cathode ray tube (CRT) displays, electroluminescence (EL) panels, organic light-emitting diode (OLED) panels, vacuum fluorescent display (VFD) panels, field-emission display (FED) panels, plasma display panels (PDPs), etc., and the non-emissive display panels include liquid crystal display (LCD) panels.

In the case of the emissive display panels such as the OLED panels, because light can be controlled for each pixel, a separate backlight unit is not required, and thus a relatively thinner display apparatus may be attained. In addition, excellent performance may be achieved in terms of the viewing angle and contrast compared with LCD panels.

SUMMARY

One or more example embodiments provide a display panel, which can secure a wide blue light-emitting diode (LED) emitting region and implement a white screen with excellent uniformity by forming a red subpixel electrode, a green subpixel electrode and a blue subpixel electrode within a single pixel and forming a white pixel electrode in the remaining region of the single pixel, and which can improve the service life by reducing the average driving current density, and a display apparatus having the same.

Additional aspects of the disclosure will be set forth in part in the description which follows and, in part, will be obvious from the description, or may be learned by practice of the disclosure.

In accordance with an aspect of the present disclosure, a display panel may include: a light source which includes a red subpixel region, a green subpixel region, a blue subpixel region, and at least one white subpixel region; a red pixel electrode configured to supply a current to the red subpixel region; a green pixel electrode configured to supply the current to the green subpixel region; a blue pixel electrode configured to supply the current to the blue subpixel region. At least one white pixel electrode disposed in at least one from among between the red pixel electrode and the green pixel electrode and between the green pixel electrode and the blue pixel electrode. The at least one white pixel electrode may be configured to supply the current to the at least one white subpixel region.

The display panel may further include a quantum dot color filter layer which includes a red light converter configured to convert incident light into red light, a green light converter configured to convert incident light into green light, and a light transmitter configured to transmit incident light.

The red subpixel region may emit blue light toward the red light converter, the green subpixel region may emit the blue light toward the green light converter, and the blue subpixel region may emit the blue light toward the light transmitter.

The at least one white subpixel region may be configured to emit blue light incident on at least one from among the red light converter, the green light converter, and the light transmitter.

The red pixel electrode, the green pixel electrode, and the blue pixel electrode may constitute a single pixel. The at least one white pixel electrode may be disposed in the remaining region of the single pixel except for a region in which the red pixel electrode, the green pixel electrode, and the green pixel electrode are disposed.

The red pixel electrode may have a first width smaller than a second width of the red light converter. The green pixel electrode may have a third width smaller than a fourth width of the green light converter. The blue pixel electrode may have a fifth width smaller than a sixth width of the light transmitter.

The at least one white pixel electrode may have a seventh width greater than an eighth width of a first interval between the red light converter and the green light converter or a ninth width of a second interval between the green light converter and the light transmitter.

The display panel may further include at least one partition wall disposed between the red light converter and the green light converter and at least one partition wall disposed between the green light converter and the light transmitter. The at least one partition wall disposed between the red light converter and the green light converter and the at least one partition wall disposed between the green light converter and the light transmitter may be made of a black material that absorbs light.

The display panel may further include: an anti-reflective layer disposed in front of the quantum dot color filter layer.

The display panel may further include a reflective layer disposed on a front surface of the at least one partition wall disposed between the red light converter and the green light converter and the at least one partition wall disposed between the green light converter and the light transmitter configured to reflect incident light.

The light transmitter may include dispersion particles configured to disperse incident light.

The light transmitter may include a blue dye configured to transmit blue light and absorb incident light other than the blue light.

In accordance with another aspect of the present disclosure, a display apparatus may include: a light source which includes a red subpixel region, a green subpixel region, a blue subpixel region, and a white subpixel region; a red pixel electrode configured to supply a current to the red subpixel region; a green pixel electrode configured to supply the current to the green subpixel region; a blue pixel electrode configured to supply the current to the blue subpixel region; at least one white pixel electrode disposed in at least one from among between the red pixel electrode and the green pixel electrode and between the green pixel electrode and the blue pixel electrode, the at least one white pixel electrode being configured to supply the current to the white subpixel region; a thin-film-transistor (TFT) array which includes a red TFT connected to the red pixel electrode, a green TFT connected to the green pixel electrode, a blue TFT connected to the blue pixel electrode, and at least one white TFT connected to the at least one white pixel electrode; and a controller configured to turn on the red TFT, the green TFT, the blue TFT, and the at least one white TFT to output white light.

The display apparatus may further include a quantum dot color filter layer which includes a red light converter configured to convert incident light into red light, a green light converter configured to convert incident light into green light, and a light transmitter configured to transmit incident light.

The red subpixel region may emit blue light toward the red light converter, the green subpixel region may emit the blue light toward the green light converter, and the blue subpixel region may emit the blue light toward the light transmitter.

The at least one white subpixel region may be configured to emit blue light incident on at least one from among the red light converter, the green light converter, and the light transmitter.

The red pixel electrode, the green pixel electrode, and the blue pixel electrode may constitute a single pixel. The at least one white pixel electrode may be disposed in a remaining region of the single pixel except for a region in which the red pixel electrode, the green pixel electrode, and the blue pixel electrode are disposed.

The red pixel electrode may have a first width smaller than a second width of the red light converter. The green pixel electrode may have a third width smaller than a fourth width of the green light converter. The blue pixel electrode may have a fifth width smaller than a sixth width of the light transmitter.

The at least one white pixel electrode may have a seventh width greater than an eighth width of a first interval between the red light converter and the green light converter or a ninth width of a second interval between the green light converter and the light transmitter.

BRIEF DESCRIPTION OF THE DRAWINGS

These above and other aspects, features, and advantages of certain embodiments of the present disclosure will be more apparent from the following description taken in conjunction with the accompanying drawings, in which.

DETAILED DESCRIPTION

Figure 1:
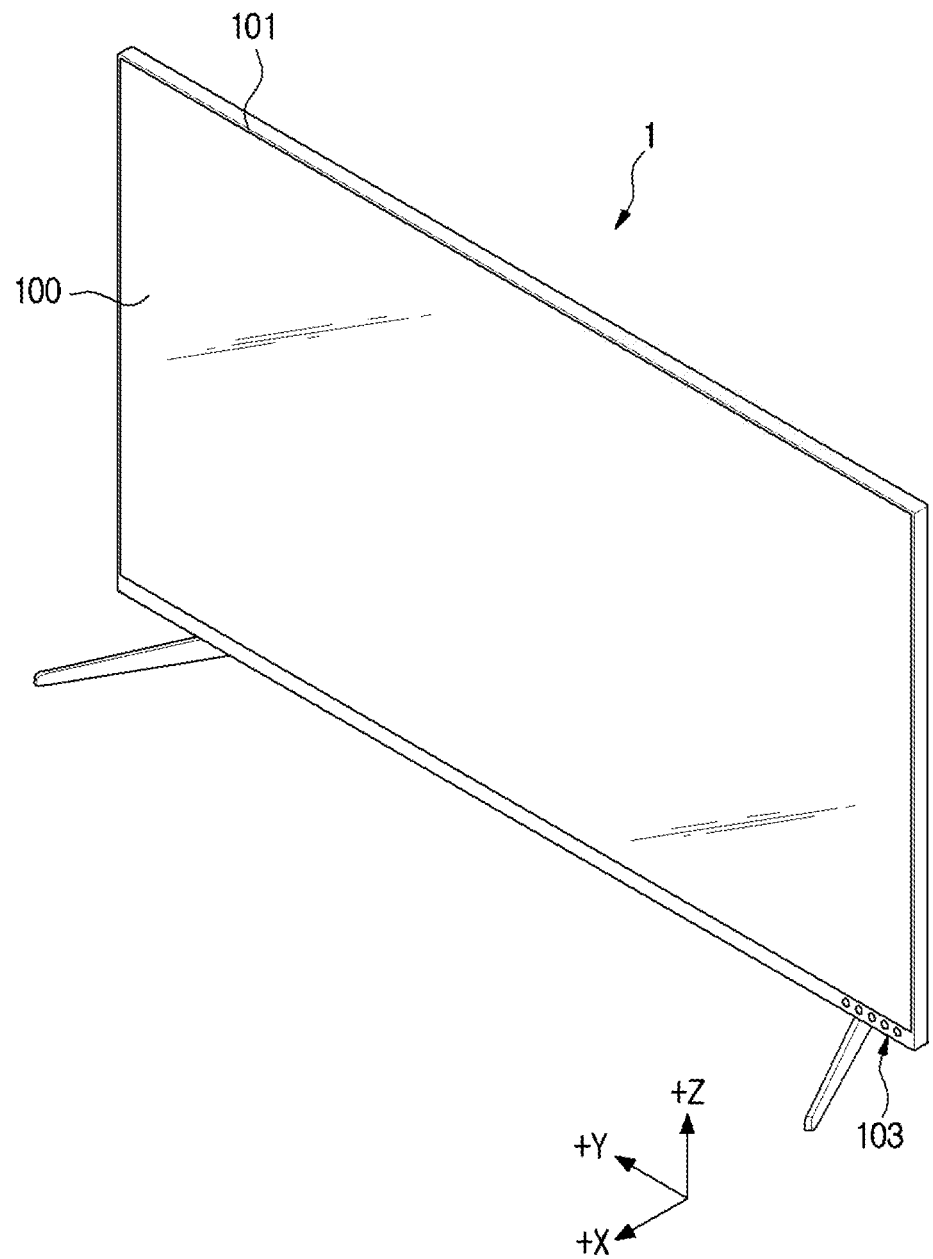
FIG. 1 is a view illustrating an exterior of a display apparatus according to an embodiment.

Reference will now be made in detail to exemplary embodiments, with reference to the accompanying drawings. In the drawings, parts irrelevant to the description are omitted to clearly describe the exemplary embodiments, and like numerals refer to like elements throughout the specification. Not all elements of the embodiments of the present disclosure will be described, and the description of what are commonly known in the art or what overlaps each other in the embodiments will be omitted. The terms as used throughout the specification, such as "part," "module," "member," "block," "unit," etc., may be implemented in software (e.g., programs, applications, firmware, etc.) and/or hardware (e.g., circuits, microchips, processors, etc.), and a plurality of "parts," "modules," "members," "blocks," or "units" may be implemented in a single element, or a single "part," "module," "member," "block," or "unit" may include a plurality of elements.

It will be further understood that the term "connect" or its derivatives refer to either a direct or indirect connection, and the indirect connection includes a connection over a wireless communication network.

The terms "include (or including)" or "comprise (or comprising)" are inclusive or open-ended and do not exclude additional, unrecited elements or method steps, unless otherwise mentioned. Expressions such as "at least one of," when preceding a list of elements, modify the entire list of elements and do not modify the individual elements of the list. For example, the expression, "at least one of a, b, and c," should be understood as including only a, only b, only c, both a and b, both a and c, both b and c, or all of a, b, and c.

It is to be understood that the singular forms "a," "an," and "the" include plural references and vice versa, unless the context clearly dictates otherwise. It will be apparent that though the terms "first," "second," "third," etc. may be used herein to describe various members, components, regions, layers, and/or sections, these members, components, regions, layers, and/or sections should not be limited by these terms. These terms are only used to distinguish one member, component, region, layer, or section from another region, layer, or section. Thus, a first member, component, region, layer, or section discussed below could be termed a second member, component, region, layer, or section without departing from the teachings of the example embodiments.

Hereinafter, embodiments of a display panel and a display apparatus having the same will be described in detail with reference to the accompanying drawings.

FIG. 1 is a view illustrating an exterior of a display apparatus according to an embodiment.

A display apparatus 1 is an apparatus capable of processing an image signal received from the outside (e.g., external image source) and visually displaying the processed image. As shown in FIG. 1, the display apparatus 1 may be implemented as a TV, but the embodiment of the display apparatus 1 is not limited thereto. For example, the display apparatus 1 may be implemented as a monitor of a computer, or may be included in a navigation terminal device or various portable terminal devices. Here, the portable terminal devices may be a desktop computer, a laptop computer, a smartphone, a tablet personal computer (PC), a wearable computing device, or a personal digital assistant (PDA).

The display apparatus 1 may include a main body 101 that forms an exterior of the display apparatus 1 (e.g., chassis) and accommodates or supports various components constituting the display apparatus 1, and a display panel 100 that displays an image.

The main body 101 may be provided with an inputter 103 (e.g., input interface) for receiving a user's command related to power on/off status of the display apparatus 1, volume control, luminance control of a screen, and the like. Also, a remote control may be provided separately from the inputter 103 provided in the main body 101 to receive the user's command related to the control of the display apparatus 1.

The display panel 100 may be a light-emitting display panel in which a plurality of pixels constituting the display panel 100 emits light to generate the image. A light source used for the plurality of pixels constituting the display panel 100 may generate the light by electroluminescence. For example, the light source may include an electroluminescent device such as an OLED or an LED. In the following embodiments, the OLED is used as the light source for detailed explanation.

In addition, the display apparatus 1 may be a large-format display (LFD) installed outdoors such as on a building roof or at a bus stop. Here, the outdoor environment is not necessarily limited to the outside, but should be understood to include any public place, environment, or space, either indoors or outdoors, where a large number of people may congregate, such as a subway station, a shopping mall, a movie theater, an office, a store, etc.

The display apparatus 1 may receive a video signal and an audio signal from various content sources, and may output a video and audio corresponding to the video signal and the audio signal. For example, the display apparatus 1 may receive television broadcast content through a broadcast receiving antenna or a cable, receive content from a content reproduction device (e.g., a set-top box, a digital versatile disc (DVD) player, a digital video recorder (DVR), etc.), or receive content from a content providing server of a content provider.

In the embodiment described later, the direction in which the image is output to the viewer, that is, the +X direction may be referred to as forward and the −X direction opposite thereto may be referred to as rearward.

Figure 2:
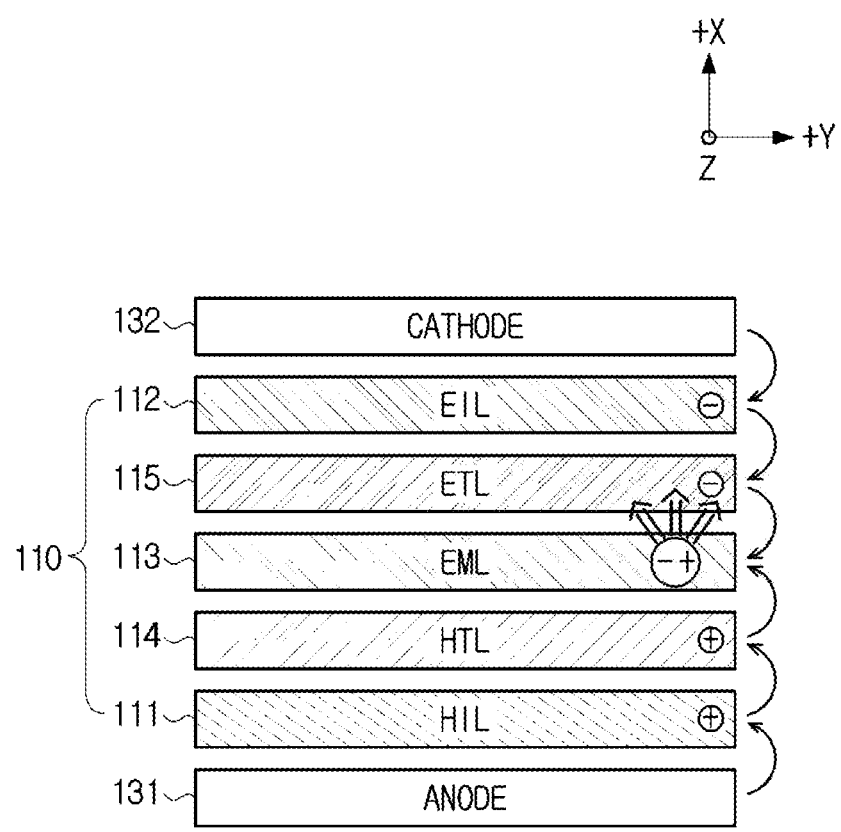
FIG. 2 is a view illustrating a structure of an OLED which is used as a light source of a display panel according to an embodiment.
Figure 3:
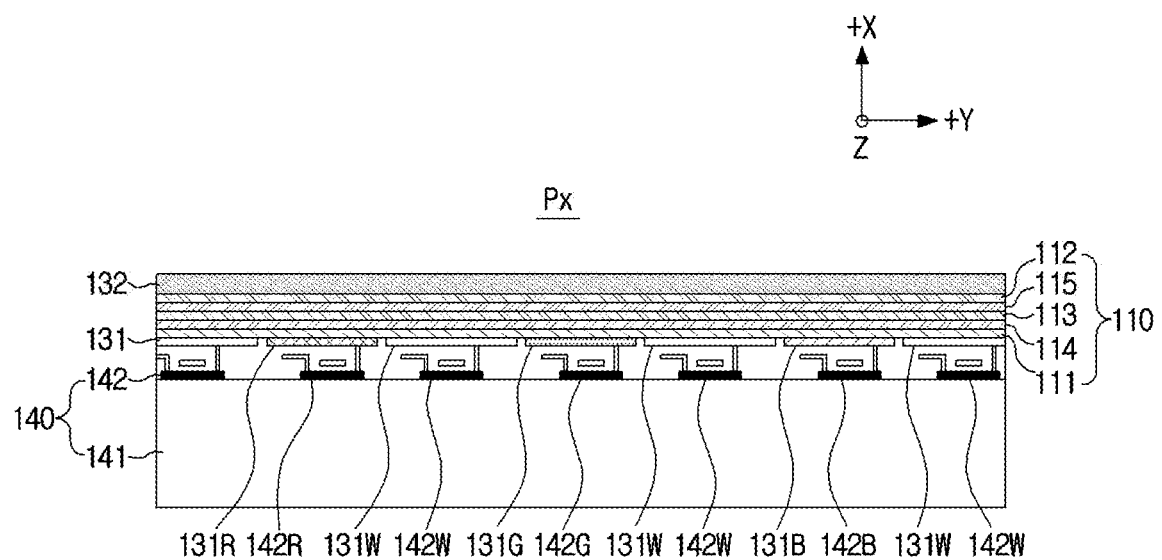
FIG. 3 is a view illustrating a structure for driving the light source in the display panel according to an embodiment.
Figure 4:
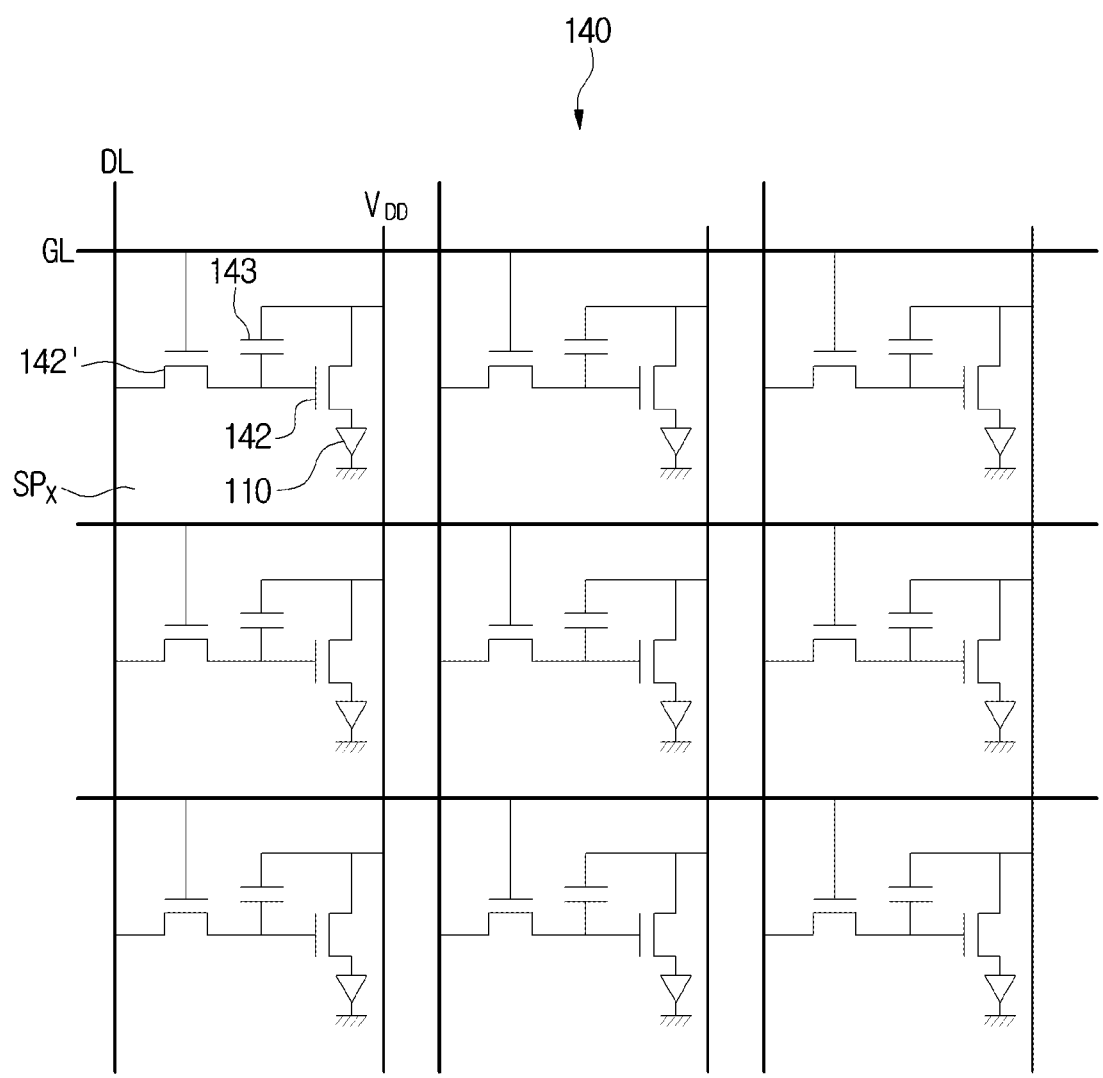
FIG. 4 is a view illustrating a circuit structure of a TFT array which is used in the display panel according to an embodiment.

FIG. 2 is a view illustrating a structure of an OLED which is used as a light source of a display panel according to an embodiment. FIG. 3 is a view illustrating a structure for driving the light source in the display panel according to an embodiment. FIG. 4 is a view illustrating a circuit structure of a TFT array which is used in the display panel according to an embodiment. FIGS. 2 and 3 are cross-sectional side views. The upper direction (i.e., +X) in FIGS. 2 and 3 corresponds to the front of the display apparatus.

A light source 110 used in the display panel 100 according to the embodiment includes an emitting layer (EML) 113, a hole transporting layer (HTL) 114 disposed at the rear of the emitting layer 113, an electron transporting layer (ETL) 115 disposed in front of the emitting layer 113, a hole injection layer (HIL) 111 disposed at the rear of the hole transporting layer 114, and an electron injection layer (EIL) 112 disposed in front of the electron transporting layer 115.

Holes may be injected from an anode 131 to the hole transporting layer 114 through the hole injection layer 111 and electrons may be injected from a cathode 132 to the electron transporting layer 115 through the electron injection layer 112.

The holes passing through the hole transporting layer 114 and the electrons passing through the electron transporting layer 115 move to the emitting layer 113 and recombine. The electrons and the holes are recombined to generate an exciton having high energy. When the exciton with the high energy falls into a low energy state, it may emit light while emitting energy.

For example, the emitting layer 113 may emit blue system light (hereinafter, referred to as blue light). The emitting layer 113 may be disposed at least of an electroluminescent element of a blue quantum dot (QD) system, the electroluminescence of a blue fluorescent system, the electroluminescence of a blue thermally activated delayed fluorescent system, and an electroluminescence of a blue phosphorescent system.

A single pixel constituting the display panel 100 may include a red subpixel for outputting red light, a green subpixel for outputting green light, and a blue subpixel for outputting blue light.

FIG. 3 is a view illustrating a structure of a single pixel. Referring to FIG. 3, the anode 131 injecting the holes into the emitting layer 113 may include a red pixel electrode 131R corresponding to the red subpixel, a green pixel electrode 131G corresponding to the green subpixel, and a blue pixel electrode 131B corresponding to the blue subpixel.

In addition, the anode 131 may further include a white pixel electrode 131W disposed in the remaining region of the single pixel, which is a region other than where the red pixel electrode 131R, the green pixel electrode 131G and the blue pixel electrode 131B are disposed. The white pixel electrode 131W may supply the light to adjacent peripheral pixels. A detailed description of the white pixel electrode 131W will be described later.

The red pixel electrode 131R, the green pixel electrode 131G and the blue pixel electrode 131B and at least one of the white pixel electrodes 131W may implement one unit pixel Px.

Each of the anodes 131R, 131G, 131B, and 131W may be composed of a metal electrode such as silver (Ag) or aluminum (Al), or may be implemented as a transparent electrode.

A TFT array 140 may be disposed at the rear of the anode 131. The TFT array 140 may include a plurality of TFTs 142 arranged on a substrate 141 and the substrate 141 may be in a two-dimensional matrix form. The plurality of TFTs 142 may be provided so as to correspond to the respective anodes 131R, 131G, 131B, and 131W.

The red pixel electrode 131R, the green pixel electrode 131G and the blue pixel electrode 131B, and at least one of the white pixel electrodes 131W may be connected to the TFT 142 corresponding to each pixel electrode and be independently driven.

The TFT 142 may be composed of a gate, a source, and a drain, and may be electrically connected to each of the anodes 131R, 131G, 131B, and 131W to supply the current. Thus, the on/off control or the brightness control of the red subpixels, the green subpixels, and the blue subpixels may be independently performed.

FIG. 4 is a view illustrating a circuit structure of a TFT array. The display panel 100 may be driven independently for each subpixel. Therefore, the circuit of the TFT array 140 may also be provided in units of subpixels SPx.

A switch TFT 142' for determining whether a voltage is received, that is, whether the pixel is turned on/off, and a driving TFT 142 for determining how much current is to be supplied to the light source 110 may be provided in each subpixel (SPx) region. In the embodiment described below, the TFT 142 electrically connected to the anode 131 may refer to the driving TFT, or may include both the switch TFT and the driving TFT.

The TFT array 140 may be provided with a gate line GL for controlling the ON/OFF status of the switch TFT 142', a data line DL for supplying the voltage to the pixel, and a power supply line $V_{DD}$ for supplying a constant voltage for one frame.

As a particular example, a case where a voltage of 15 V is supplied from the power supply line $V_{DD}$ and a voltage of 10 V is applied to the data line DL will be described as the example. When the voltage of 10 V is applied to the data line $V_{DD}$, an ON signal may be transmitted from the gate line GL to the switch TFT 142'. When the switch TFT 142' is turned on, the voltage of the data line DL is applied to the pixel. A voltage of 5 V is stored in a capacitor 143 because the voltage of 15 V in the power supply line $V_{DD}$ and the voltage of 10 V in the data line DL are reversely applied. The current applied by the driving TFT 142 may be determined according to the voltage stored in the capacitor 143. For example, the driving TFT 142 may apply a current of 1 µA to the light source 110, and the light source 110 may emit the light corresponding to the applied current.

A controller for controlling the display panel 100 may determine the on/off state of each subpixel, the amount of current applied, and the like according to a video signal to be output, and may output a desired image by applying an on/off signal and a voltage signal through the gate line GL and the data line DL.

Referring again to FIG. 3, the light source 110 having the above-described structure may be disposed in front of the anode 131 and the cathode 132 may be disposed in front of the light source 110. The cathode 132 may be a transparent electrode for transmitting the light emitted from the light source 110, and may be disposed of a material such as indium-tin oxide (ITO).

Figure 5:
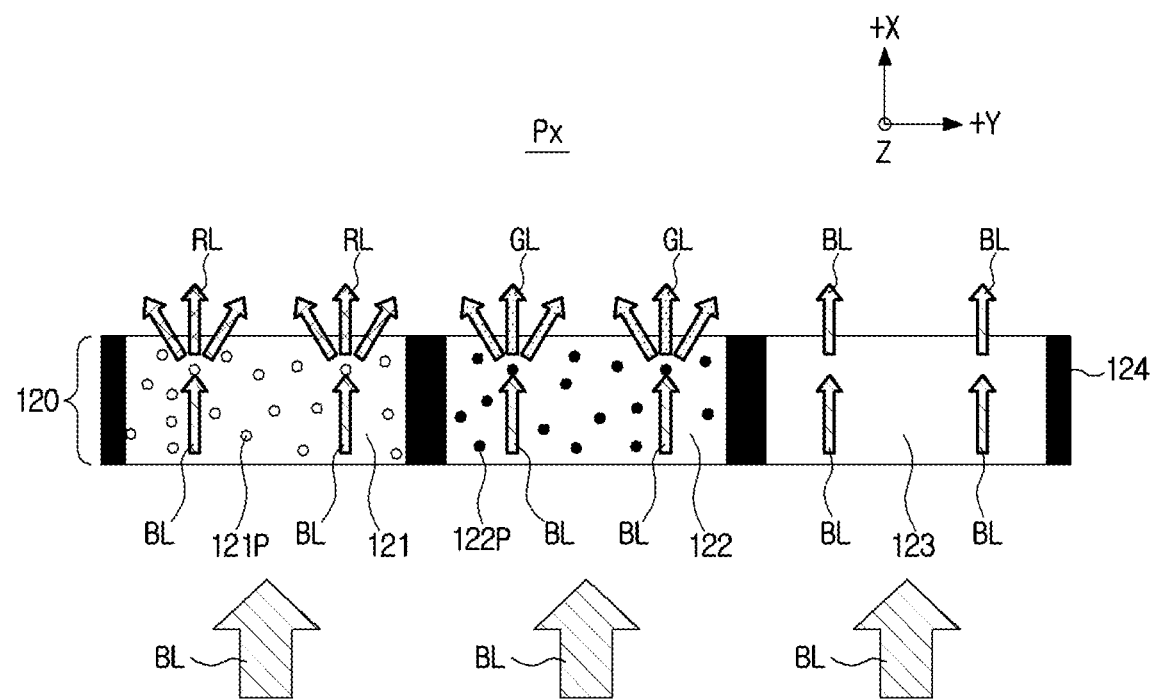
FIG. 5 is a cross-sectional side view illustrating a structure of a quantum dot color filter layer which is used in the display panel according to an embodiment.

FIG. 5 is a cross-sectional side view illustrating a structure of a quantum dot color filter layer which is used in the display panel according to an embodiment.

Referring to FIG. 5, blue light BL emitted from the light source 110 may be incident on a quantum dot color filter layer 120 disposed in front of the light source 110. The quantum dot color filter layer 120 may convert the incident blue light BL into red light RL and green light GL, and output the blue light BL.

The quantum dot color filter layer 120 may include a red light converter 121, which is configured for converting incident light into the red light by using the quantum dot (QD), a green light converter 122 which is configured for converting the incident light into the green light, and a light transmitter 123 which is configured for facilitating a propagation of the incident light.

The quantum dot may refer to semiconductor crystals formed by aggregating hundreds to thousands of atoms. The quantum dot may be in a range of several nanometers to tens of nanometers. Because of the small size, the quantum dot may take advantage of a quantum confinement effect.

According to the quantum confinement effect, when the particles are very small, electrons in a particle form a discrete energy state by an outer surface of the particle, and because the size of a space in the particle is small, an energy state of the electron is relatively increased and a bandgap is widened.

Thus, the quantum dots, according to the above quantum confinement effect, may be used to generate light having various wavelengths when light such as ultraviolet light, visible light, and/or the like is incident thereon. In this case, the quantum dot disperses and emits the incident light.

A length of a wavelength of light generated from quantum dots may depend on a size of a particle. In particular, when light has a wavelength having a greater energy than bandgap energy is incident onto the quantum dot, the quantum dot absorbs energy of the light and is excited, emits light having a predetermined wavelength, and thus, becomes a ground state.

In this case, when the size of the quantum dot is small, light having a relatively short wavelength such as blue-based light or green-based light may be generated, and when the size of the quantum dot is large, light having a relatively long wavelength such as red-based light may be generated. Thus, light of various colors may be implemented based on sizes of the quantum dots.

Hereinafter, a quantum dot particle capable of converting the incident light into the green light is referred to as a green quantum dot particle, and a quantum dot particle capable of converting the incident light into the red light is referred to as a red quantum dot particle.

For example, the green quantum dot particle may have a width in a range of 2 nm to 3 nm, and the red quantum dot particle may have a width in a range of 5 nm to 6 nm.

The red light converter 121 may include a plurality of red quantum dot particles 121P, and the green light converter 122 may include a plurality of green quantum dot particles 122P. The size of the red quantum dot particles 121P in the red light converter 121 may be set to be relatively greater than the size of the green quantum dot particles in the green light converter 122.

When the blue light BL emitted from the light source 110 is incident on the red light converter 121, the blue light BL incident on the red quantum dot particles 121P may be converted to the red light RL. The converted red light RL may be scattered in various directions and emitted.

When the blue light BL emitted from the light source 110 is incident on the green light converter 122, the blue light BL incident on the green quantum dot particles 122P may be converted to the green light GL. The converted green light GL may be scattered in various directions and emitted.

The light transmitter 123 may be formed of a light transmitting material capable of transmitting incident light and may also be formed to be hollow to allow the incident light to pass through without significantly altering the color thereof.

The light transmission material may include a material having a transparency value greater than or equal to a predetermined level such as a resin including a natural resin, a synthetic resin or glass and/or the like. The synthetic resin may include an epoxy resin, an urethane resin, polymethyl methacrylate (PMMA), and/or the like, and the glass may include silicate glass, borate glass, phosphate glass, and/or the like. Additionally, various materials capable of transmitting various types of light may be used as the light transmitting material according to one or more exemplary embodiments.

To partition the respective cells of the red light converter 121, the green light converter 122, and the light transmitter 123, there may be partition walls 124 at the boundary between the red light converter 121, the green light converter 122 and the light transmitter 123. The partition walls 124 may be configured to block the light from propagating into another cell, thereby improving the contrast. A detailed description of the partition walls 124 will be described later.

As described above, when the three primary colors—red, green, and blue (RGB)—are implemented by emitting the blue light in the light source 110 and converting the blue light into the red light and the green light in the quantum dot color filter layer 120, it is possible to obtain excellent efficiency compared to the case of implementing the three primary colors RGB by emitting the white light from the light source and absorbing light with colors other than the specific wavelength in the quantum dot color filter layer.

Figure 6:
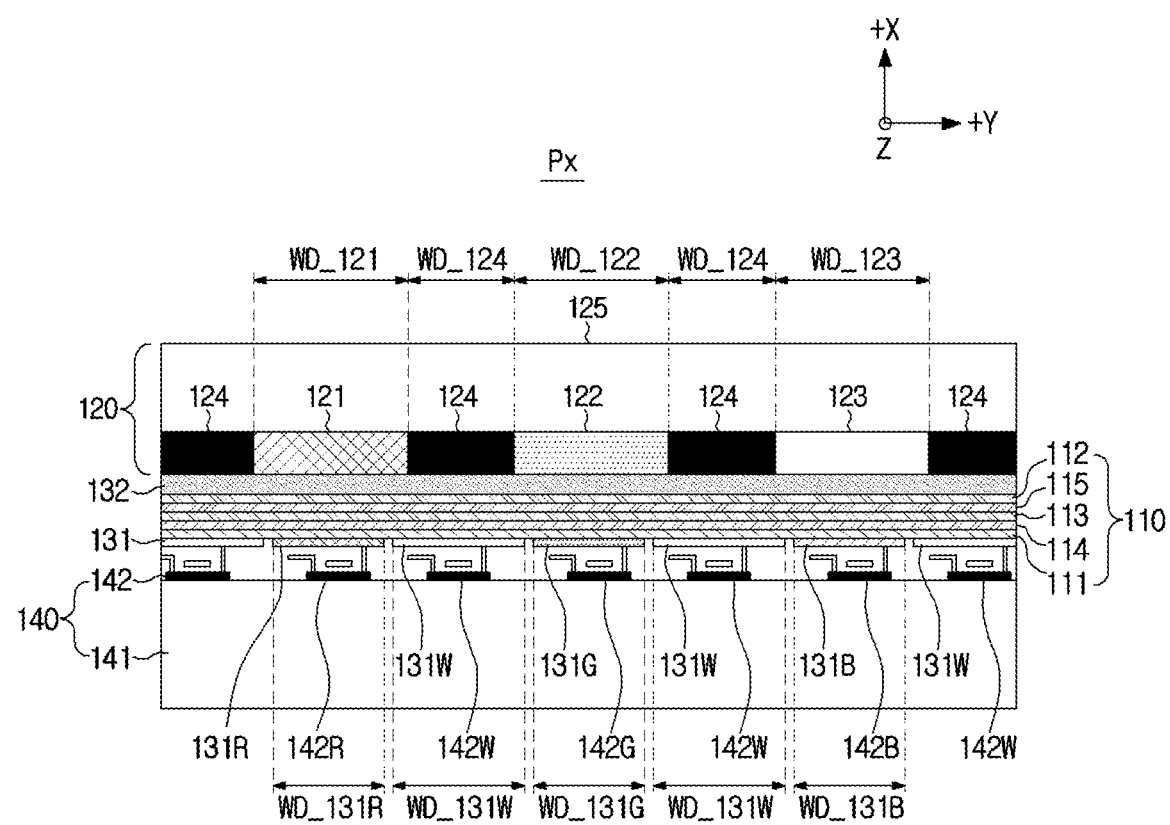
FIG. 6 is a cross-sectional side view illustrating a structure of the display panel according to an embodiment.
Figure 7:
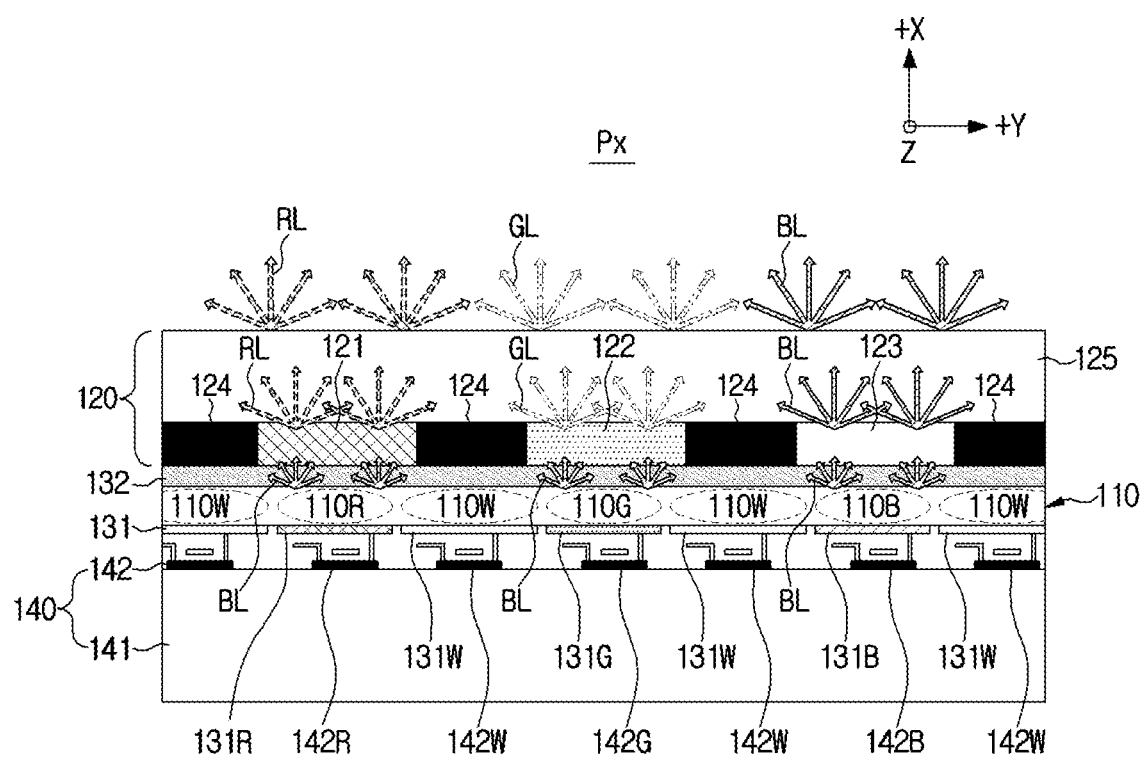
FIG. 7 is a view illustrating a process of outputting red light, green light, and blue light in the display panel according to an embodiment.

FIG. 6 is a cross-sectional side view illustrating a structure of the display panel according to an embodiment, and FIG. 7 is a view illustrating a process of outputting red light, green light, and blue light in the display panel according to an embodiment.

The red light converter 121, the green light converter 122 and the light transmitter 123 described above with reference to FIG. 5, and the partition walls 124 provided at the boundary thereof may be disposed in a color filter substrate 125 as shown in FIG. 6.

The color filter substrate 125 may be positioned in front of the red light converter 121, the green light converter 122 and the light transmitter 123, and the partition walls 124 may be provided at the boundary thereof. The color filter substrate 125 may be formed of a transparent material so that the light emitted from the red light converter 121, the green light converter 122, and the light transmitter 123 can be output to the outside.

The light source 110 described above with reference to FIG. 3, the anode 131 and the cathode 132 for supplying the holes and electrons to the light source 110, and the TFT array 140 for controlling each subpixel may be disposed at the rear of the quantum dot color filter layer 120.

In particular, the TFT 142 serving as a switch for controlling each subpixel may be disposed on the substrate 141. At this time, each of the TFTs 142 may be disposed at a position corresponding to the corresponding subpixel.

The anode 131 corresponding to the respective subpixels may be disposed in front of the TFT array 140 and may be electrically connected to the TFTs 142 corresponding to the respective subpixels. As described above, the anode 131 may include the red pixel electrode 131R corresponding to the red subpixel, the green pixel electrode 131G corresponding to the green subpixel, the blue pixel electrode 131B corresponding to the blue subpixel, and the white pixel electrode 131W for supplying the light to adjacent peripheral pixels.

The red pixel electrode 131R may be electrically connected to a red TFT 142R for controlling the red subpixel, the green pixel electrode 131G may be electrically connected to a green TFT 142G for controlling the green subpixel, and the blue pixel electrode 131B may be electrically connected to a blue TFT 142B for controlling the blue subpixel.

In addition, the white pixel electrode 131W may be electrically connected to a white TFT 142W for controlling the white subpixel.

The cathode 132 may be disposed in front of the anode 131 and the light source 110 may be disposed between the anode 131 and the cathode 132. When the TFT 142 controlling each subpixel is turned on so that the anode 131 supplies the current to the light source 110 and the cathode 132 supplies electrons to the light source 110, the light may be emitted from the light source 110.

The light incident to the red light converter 121 of the quantum dot color filter layer 120 among the blue light BL emitted from the light source 110 is converted to the red light RL and the light incident to the green light converter 122 is converted to the green light GL, respectively. The light incident on the light transmitter 123 is not converted, but is output as the blue light BL.

The red light RL that is output from the red light converter 121, the green light GL that is output from the green light converter 122 and the blue light BL that is output from the light transmitter 123 may be transmitted through the transparent color filter substrate 125 to the outside. Hereinafter, a process of outputting the red light RL, the green light GL, the blue light BL, etc. will be described in detail.

As shown in FIG. 7, the light source 110 may be divided into a red subpixel region 110R, a green subpixel region 110G, a blue subpixel region 110B, and a white subpixel region 110W.

The red subpixel region 110R may refer to a region where the light is emitted by receiving the current from the red pixel electrode 131R, the green subpixel region 110G may refer to a region where the light is emitted by receiving the current from the green pixel electrode 131G, and the blue subpixel region 110B may refer to a region where the light is emitted by receiving the current from the blue pixel electrode 131B.

In addition, the white subpixel region 110W may refer to a region where the light is emitted by receiving the current from the white pixel electrode 131W.

Each of the subpixel regions 110R, 110G, 110B, and 110W may be spaced apart from each other, may overlap with each other, and their boundaries may be in contact with each other.

The red TFT 142R, the red pixel electrode 131R, the red subpixel region 110R and the red light converter 121 may implement the red subpixels. The green TFT 142G, the green pixel electrode 131G, the green subpixel region 110G and the green light converter 122 may implement the green subpixels. The blue TFT 142B, the blue pixel electrode 131B, the blue subpixel region 110B and the light transmitter 123 may implement the blue subpixels.

When the red subpixel is turned on, the current may be applied to the red subpixel region 110R through the red pixel electrode 131R in the red TFT 142R, and the red subpixel region 110R may emit the blue light BL due to the applied current.

In the embodiment, the turning on of the subpixel may mean that an on signal is input to the gate line of the TFT array 140 by the controller of the display apparatus 100 and the current is supplied to the light source 110 through the anode 131 of the corresponding subpixel.

The blue light BL emitted from the red subpixel region 110R may be transmitted through the transparent cathode 132 and may be incident on the red light converter 121. The red subpixel region 110R may refer to a region corresponding to the red light converter 121 and the red pixel electrode 131R so that the red subpixel region 110R emits the light toward the red light converter 121.

The red light quantum dot particles 121P of the red light converter 121 may convert the incident blue light BL into the red light RL and the converted red light RL may be transmitted through the transparent color filter substrate 125 and output to the outside.

When the green subpixel is turned on, the current may be applied to the green subpixel region 110G through the green pixel electrode 131G in the green TFT 142G, and the green subpixel region 110G may emit the blue light BL due to the applied current.

The blue light BL emitted from the green subpixel region 110G may be transmitted through the transparent cathode 132 and may be incident on the green light converter 122. The green subpixel region 110G may refer to a region corresponding to the green light converter 122 and the green pixel electrode 131G so that the green subpixel region 110G emits the light toward the green light converter 122.

The green quantum dot particles 122P of the green light converter 122 may convert the incident blue light BL into the green light GL and the converted green light GL may be transmitted through the transparent color filter substrate 125 and output to the outside.

When the blue subpixel is turned on, the current may be applied to the blue subpixel region 110B through the blue pixel electrode 131B in the blue TFT 142B, and the blue subpixel region 110B may emit the blue light BL due to the applied current.

The blue light BL emitted from the blue subpixel region 110B may be transmitted through the transparent cathode 132 and may be incident on the light transmitter 123. The blue subpixel region 110B may refer to a region corresponding to the light transmitter 123 and the blue pixel electrode 131B so that the blue subpixel region 110B emits the light toward the light transmitter 123.

The blue light BL incident on the light transmitter 123 may be transmitted through the transparent color filter substrate 125 and output to the outside.

FIGS. 8 to 11 are views illustrating a process of outputting the blue light emitted from a white subpixel region to the outside in the display panel according to an embodiment.

When the white subpixel is turned on, the current may be applied through the white pixel electrode 131W in the white TFT 142W, and the white subpixel region 110W may emit the blue light BL due to the applied current.

A part of the blue light BL emitted from the white subpixel region 110W may be incident on the partition walls 124 and the part of the blue light BL may be incident on the adjacent subpixels.

Figure 8:
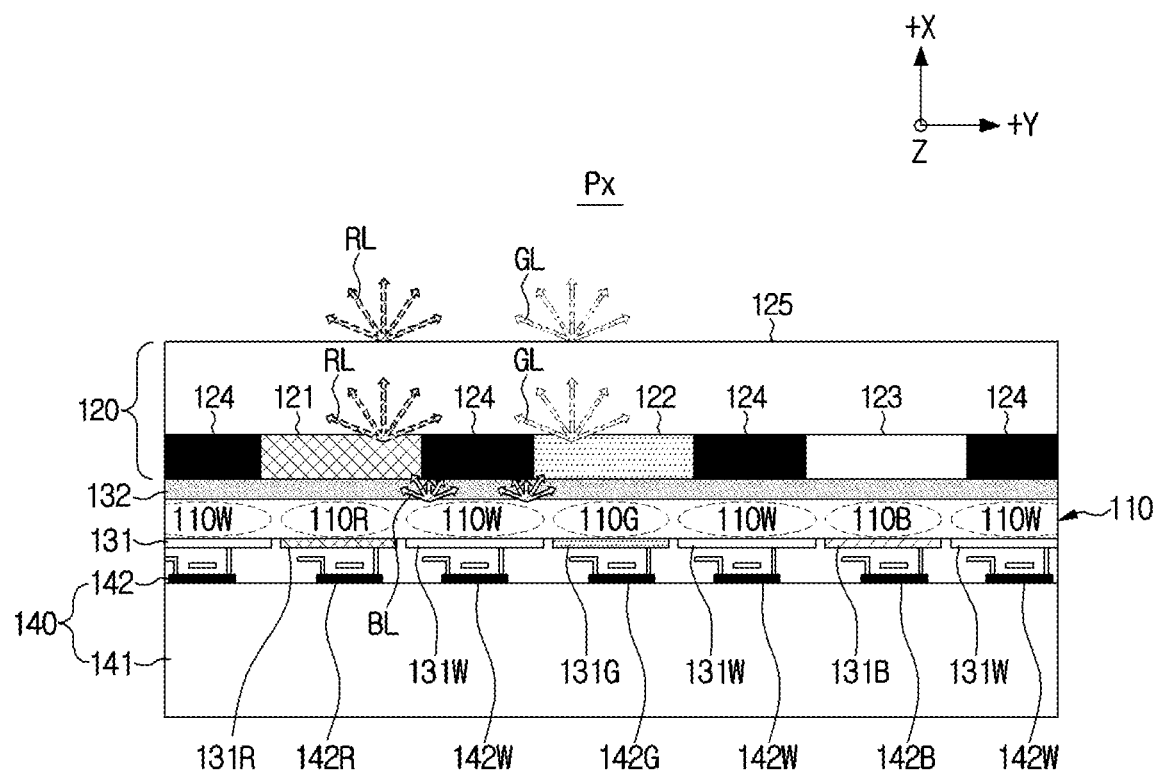
FIGS. 8, 9, 10, and 11 are views illustrating a process of outputting the blue light emitted from a white subpixel region to the outside in the display panel according to an embodiment.

Referring to the example of FIG. 8, the part of the blue light BL emitted from the white subpixel region 110W positioned between the red subpixel region 110R and the green subpixel region 110G may be incident on the red light converter 121, and the other part may be incident on the green light converter 122.

The blue light BL incident on the red light converter 121 may be converted to the red light RL and output to the outside as described above and the blue light BL incident on the green light converter 122 may be converted to the green light GL and output to the outside.

Figure 9:
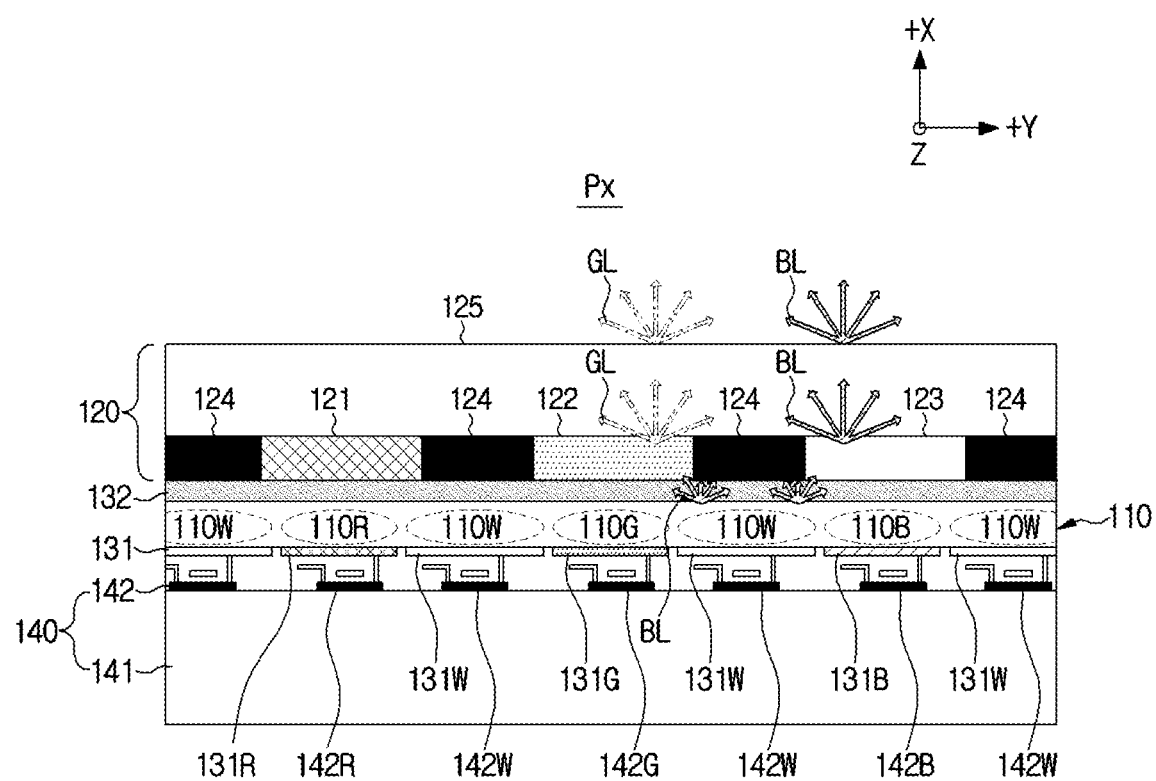

Referring to the example of FIG. 9, the part of the blue light BL emitted from the white subpixel region 110W positioned between the green subpixel region 110G and the blue subpixel region 110B may be incident on the green light converter 122, and the other part may be incident on the light transmitter 123.

The blue light BL incident on the green light converter 122 may be converted to the green light GL and output to the outside and the blue light BL incident on the light transmitter 123 may be output without being converted to another color.

Figure 10:
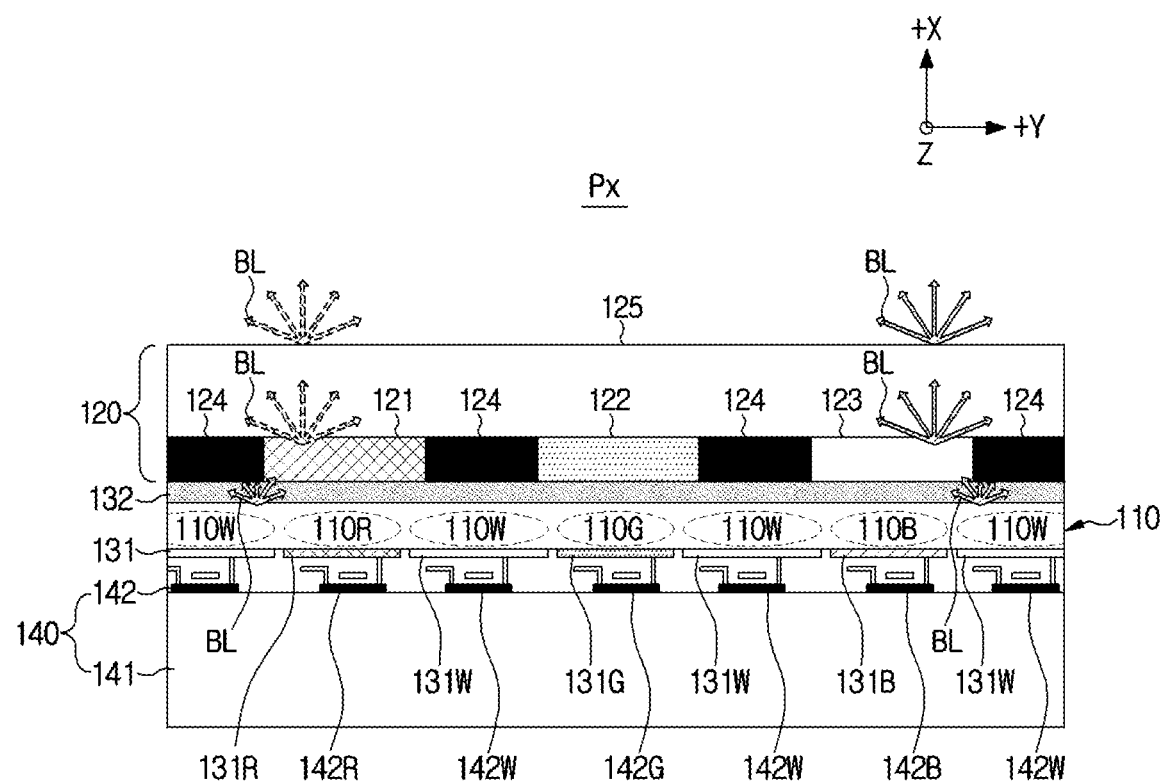

As the example of FIG. 10, when the white subpixel region 110W is provided on the left side (i.e., further in the −Y direction) of the red subpixel region 110R and on the right side (i.e., further in the +Y direction) of the blue subpixel region 110B, the part of the blue light BL emitted from the white subpixel region 110W may be incident on the red light converter 121 and the light transmitter 123.

When the red subpixel, the green subpixel or the blue subpixel is turned on, the light is emitted in the white subpixel region 110W adjacent to the turned on subpixel, and the luminance may be improved to reduce the driving current density of the light source 110, so that the service life of the display panel 100 may be improved.

Figure 11:
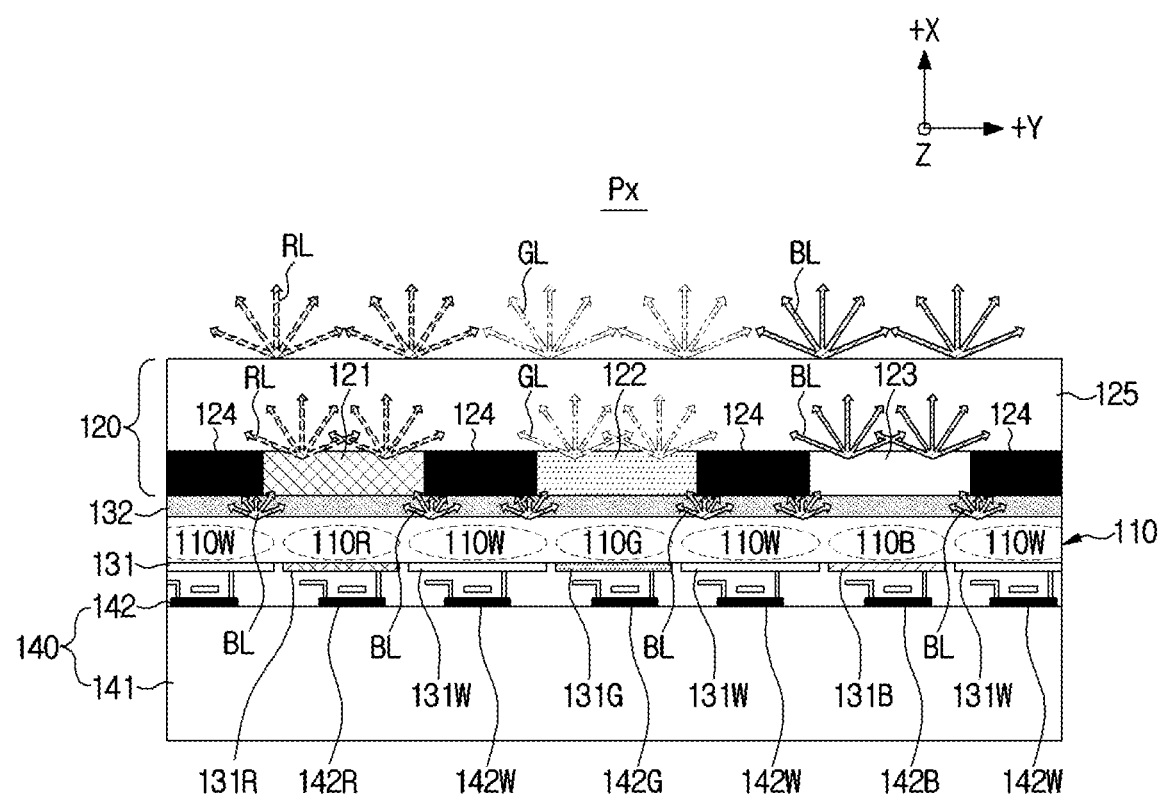

As shown in FIG. 11, when the light emitted from the white subpixel region 110W is incident on the red light converter 121, the green light converter 122 and the light transmitter 123 and output as the red light RL, the green light GL and the blue light BL, they may be mixed and visually recognized as white light. That is, as a result, the light emitted from the white subpixel region 110W may be output as the white light by the mixed colors of the RGB three primary colors.

Accordingly, when the light is emitted from a plurality of white subpixel regions 110W which include the white subpixel region 110W positioned between the red subpixel region 110R and the green subpixel region 110G and the white subpixel region 110W positioned between the green subpixel region 110G and the blue subpixel region 110B, the red light RL, the green light GL and the blue light BL may be mixed to output the white light WL to the outside.

The controller of the display apparatus 100 may turn on the red TFT 142R, the green TFT 142G, the blue TFT 141B and the white TFT 141W to apply the current to the red subpixel region 110R, the green subpixel region 110G, the blue subpixel region 110B, and the white subpixel region 110W in order to realize a white color through the display panel 100.

The controller of the display apparatus 100 may lower the driving current density by turning on the TFT corresponding to the corresponding subpixel and the TFT corresponding to the white subpixel adjacent thereto when color mixing of the red and the green, the green and the blue or the red and the blue is required.

Figure 12:
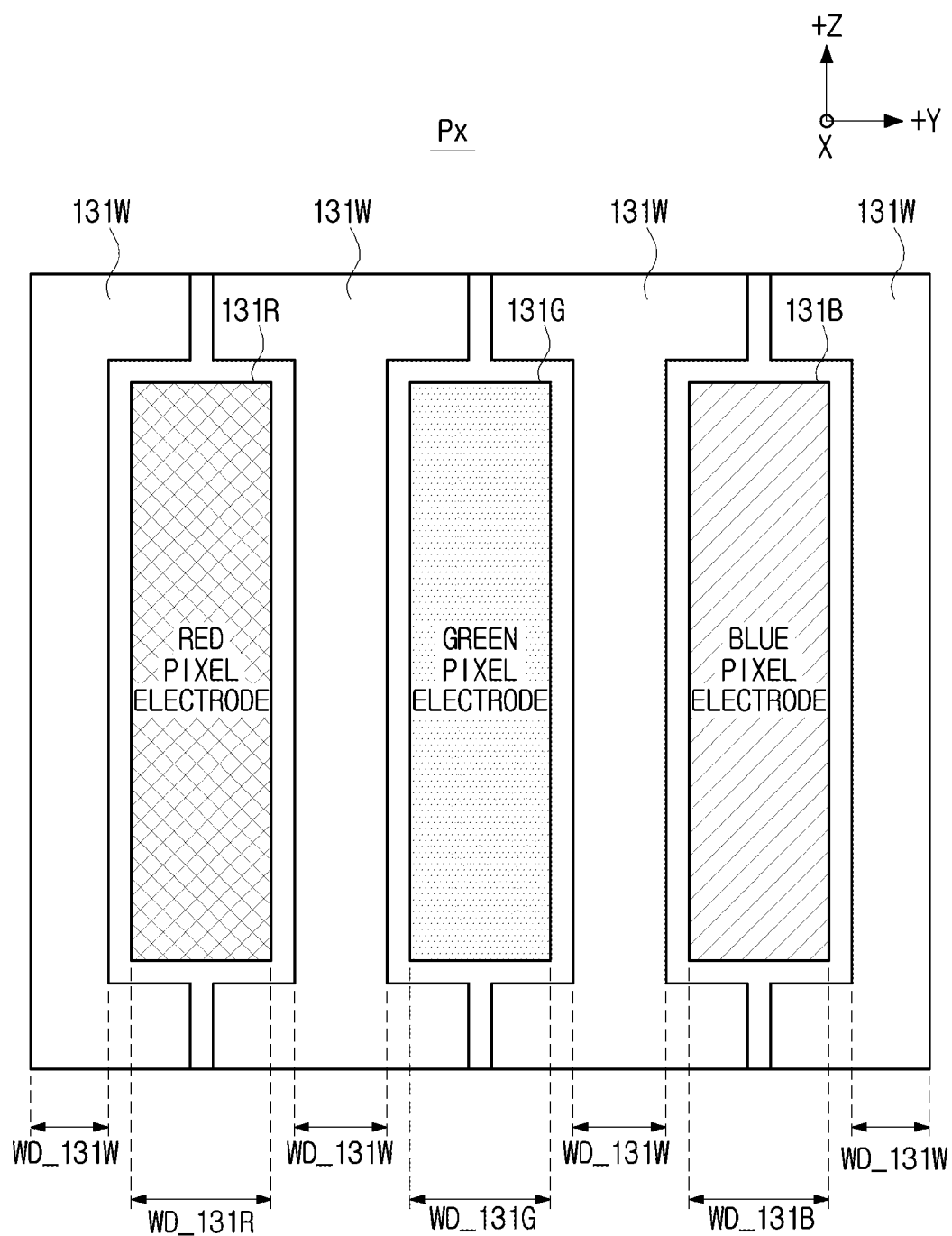
FIG. 12 is a top plane view illustrating a structure of a pixel electrode which is included in the display panel according to an embodiment.
Figure 13:
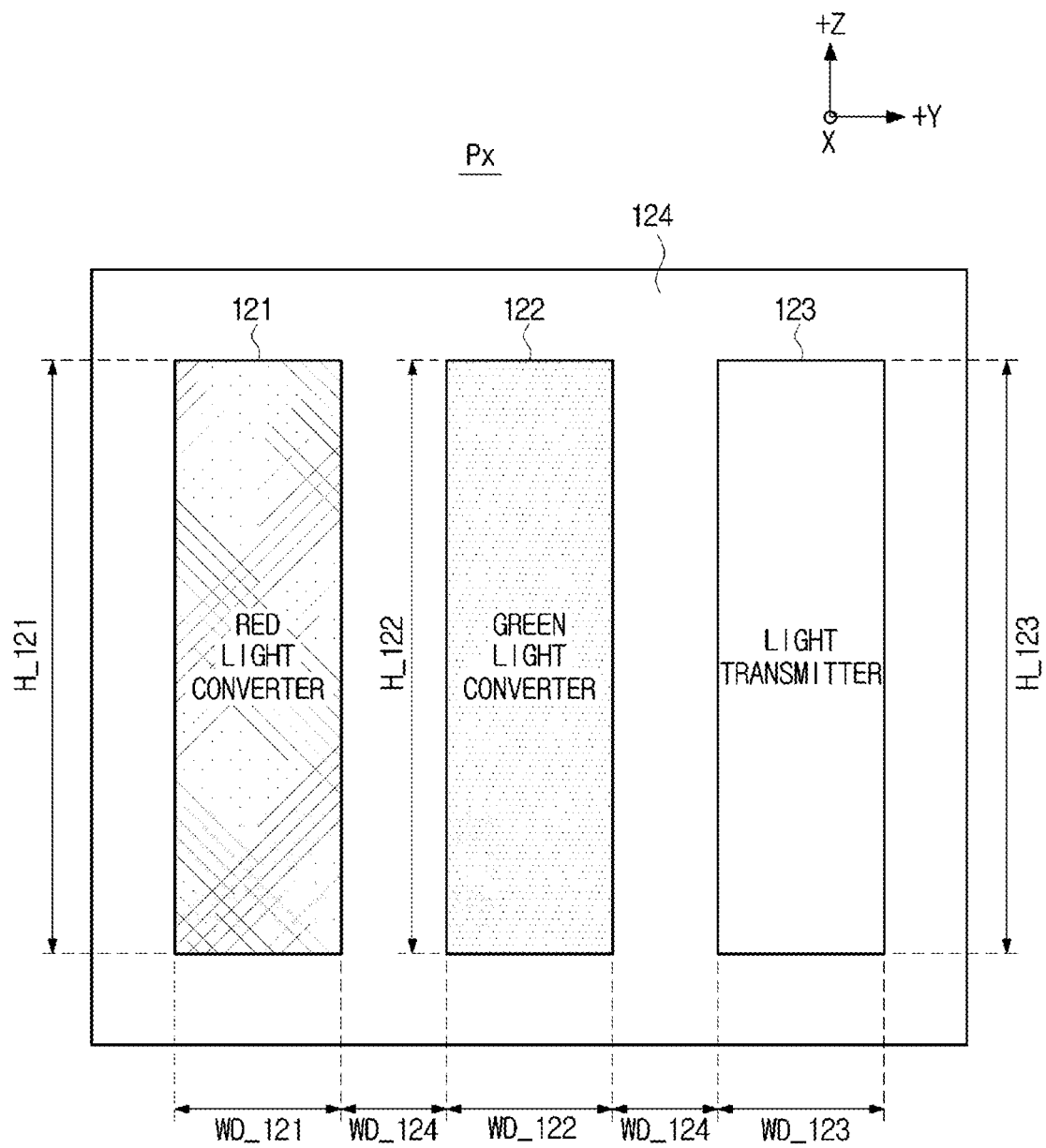
FIG. 13 is a top plane view illustrating a structure of the quantum dot color filter layer which is included in the display panel according to an embodiment.
Figure 14:
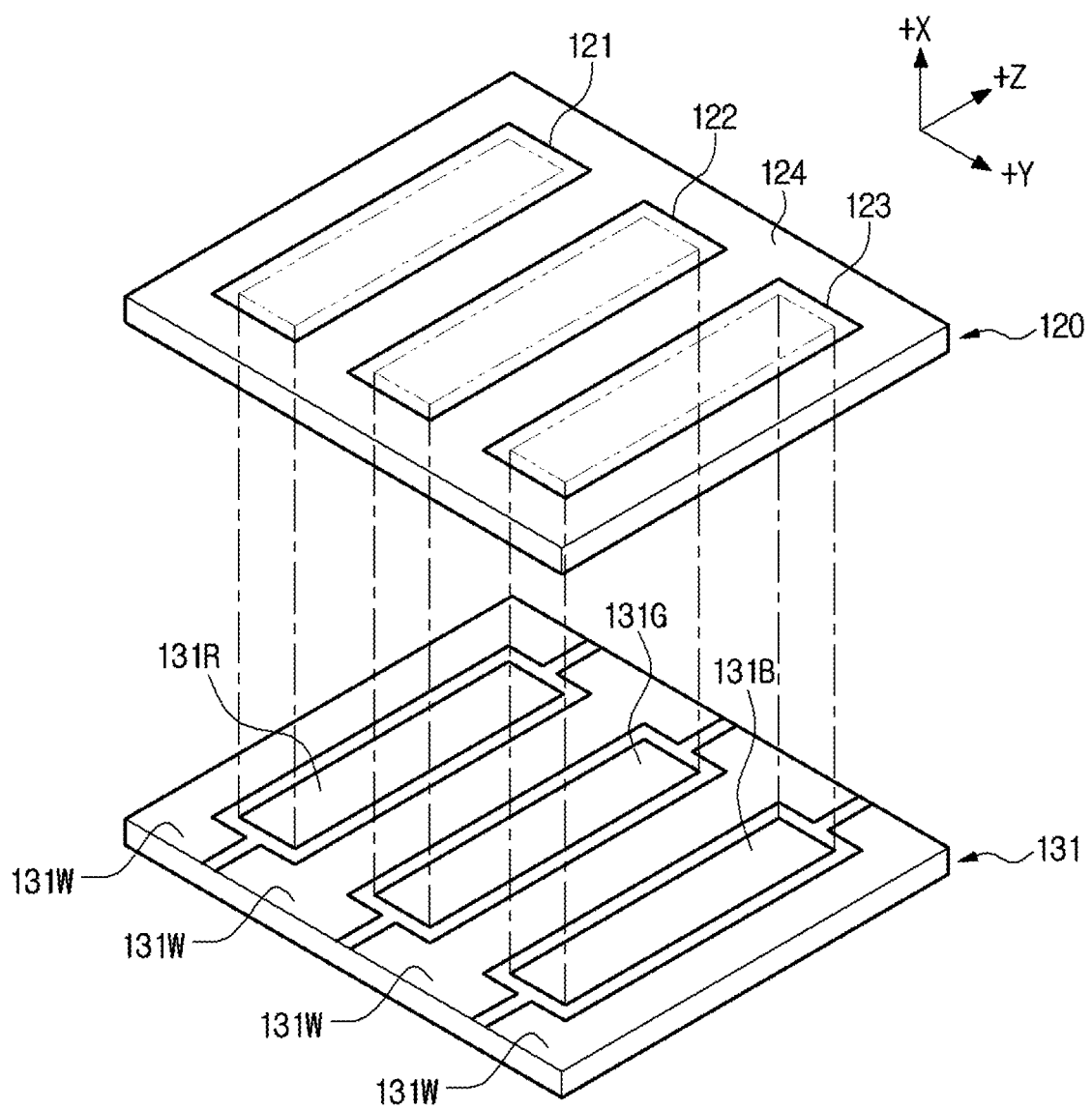
FIG. 14 is an exploded perspective view illustrating the pixel electrode and the quantum dot color filter layer together.

FIG. 12 is a top plane view illustrating a structure of a pixel electrode which is included in the display panel according to an embodiment, FIG. 13 is a top plane view illustrating a structure of a quantum dot color filter layer which is included in the display panel according to an embodiment, and FIG. 14 is an exploded perspective view illustrating the pixel electrode and the quantum dot color filter layer together.

As shown in FIG. 12, the red pixel electrode 131R, the green pixel electrode 131G, and the blue pixel electrode 131B constituting the single pixel Px may be arranged side by side and the white pixel electrodes 131W may be disposed between the red pixel electrode 131R and the green pixel electrode 131G, and between the green pixel electrode 131G and the blue pixel electrode 131B.

Further, as shown in FIG. 12, the space may be efficiently used by disposing the red pixel electrode 131R, the green pixel electrode 131G, and the blue pixel electrode 131B in the single pixel Px and disposing the white pixel electrodes 131W in the remaining regions without needing to dedicate a separate region for disposing the white pixel electrodes 131W.

Further, when the white pixel electrode 131W is disposed in the remaining region, the white pixel electrode 131W may be also disposed in areas which are not between any two electrodes. In particular, the white pixel electrode 131W may be disposed in the direction not adjacent to the green pixel electrode 131G among both lateral directions of the red pixel electrode 131R. The white pixel electrode 131W may be disposed in the direction not adjacent to the green pixel electrode 131G among both lateral directions of the blue pixel electrode 131B. In other words, the white pixel electrode 131W may be disposed in −Y direction from the red pixel electrode 131R. Also, the white pixel electrode 131W may be disposed in +Y direction from the blue pixel electrode 131B. Furthermore, the white pixel electrode 131W may be disposed in +Z direction or −Z direction from the red pixel electrode 131R, green pixel electrode 131G and blue pixel electrode 131B.

As shown in FIG. 13, the red light converter 121, the green light converter 122, and the light transmitter 123 may be connected to the red pixel electrode 131R, the green pixel electrode 131G, and the blue pixel electrode 131B, respectively, and the partition walls 124 may be disposed in the remaining regions to absorb or reflect the incident light.

As shown in FIG. 14, the quantum dot color filter layer 120 disposed in the structure of FIG. 13 may be disposed in front of the pixel electrode 131, which in turn is disposed in the structure of FIG. 12. The light source 110 and the cathode 132 may be disposed between the quantum dot color filter layer 120 and the pixel electrode 131.

Referring to FIGS. 12 to 14, the pixel electrodes 131R, 131G, and 131B may be implemented to be smaller in size than the light converters 121 and 122, and the light transmitter 123 corresponding to the pixel electrodes 131R, 131G, and 131B, so that the light emitted from each of the pixel regions is not incident on another adjacent pixel, thereby preventing unintended color mixing.

In particular, width WD_131R of the red pixel electrode 131R may be formed to be smaller than width WD_121 of the red light converter 121, thereby preventing the light emitted from the red subpixel region 110R from being incident on the peripheral the green light converter 122.

Height H_131R of the red pixel electrode 131R may also be formed to be smaller than height H_121 of the red light converter 121 in order to prevent reduction in efficiency due to unnecessary light being output.

Width WD_131G of the green pixel electrode 131G may be formed to be smaller than width WD_122 of the green light converter 122, thereby preventing the light emitted from the green subpixel region 110R from being incident on the peripheral the red light converter 121 or the light transmitter 123.

Height H_131G of the green pixel electrode 131G may also be formed to be smaller than height H_122 of the green light converter 122 in order to prevent reduction in efficiency due to unnecessary light being output.

Width WD_131B of the blue pixel electrode 131B may be formed to be smaller than width WD_123 of the light transmitter 123, thereby preventing the light emitted from the blue subpixel region 110B from being incident on the peripheral the green light converter 122.

Height H_131B of the blue pixel electrode 131G may also be formed to be smaller than height H_123 of the light transmitter 123 in order to prevent reduction in efficiency due to unnecessary light being output.

Width WD_131W of the white pixel electrode 131W may be formed greater than width WD_124 of the partition walls 124 so that the ratio of the light emitted from the white subpixel region 110W to the red light converter 121, the green light converter 122 or the light transmitter 123 can be increased.

In particular, the width WD_131W of the white pixel electrode 131W disposed between the red pixel electrode 131R and the green pixel electrode 131G may be greater than the width WD_124 of the partition walls 124 or the interval between the red light converter 121 and the green light converter 122.

The width WD_131W of the white pixel electrode 131W disposed between the green pixel electrode 131G and the blue pixel electrode 131B may be greater than the interval between the green light converter 122 and the light transmitter 123.

However, the embodiment of the display panel 100 is not limited thereto, and the width WD_131W of the white pixel electrode 131W may be formed to be less than or equal in length to the interval between the converters or the interval between the converter and the light transmitter within a range where the light emitted from the white pixel region 110W can be incident on the adjacent red light converter 121, the green light converter 122, or the light transmitter 123.

Figure 15:
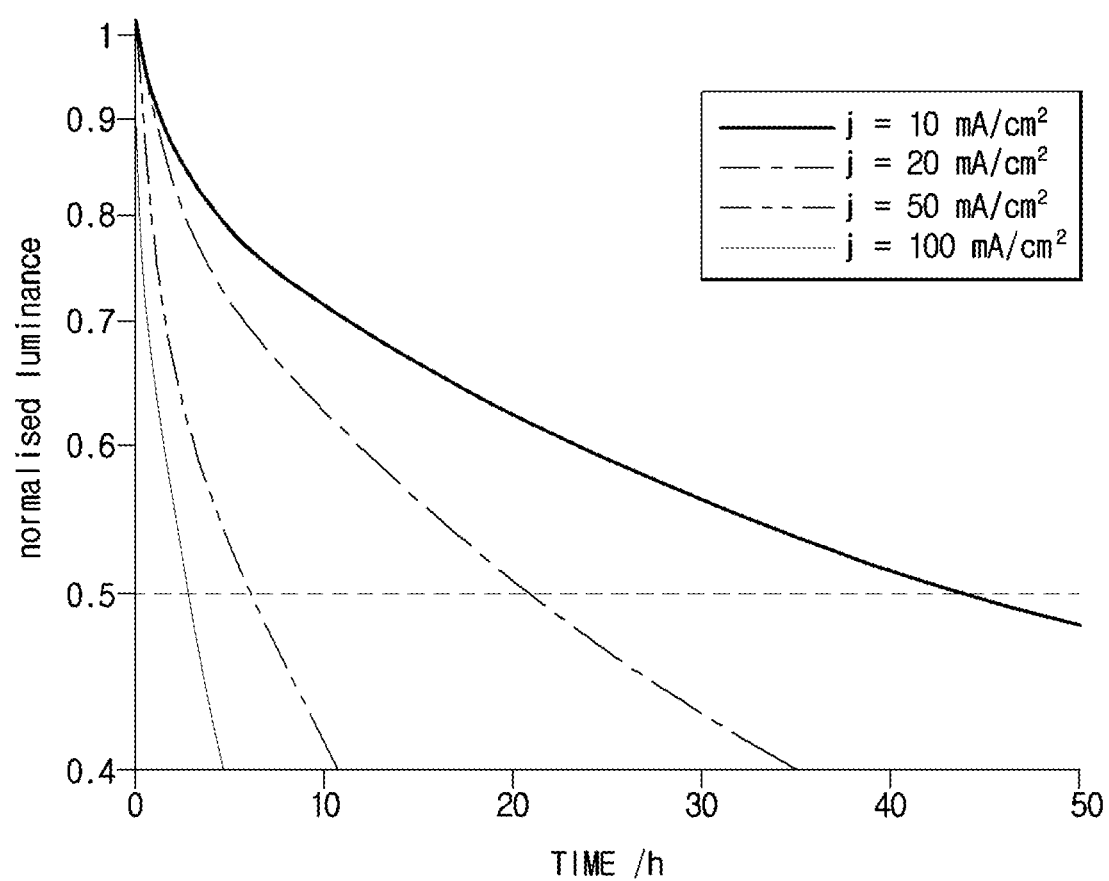
FIG. 15 is a graph illustrating the relationship between a driving current density and the service life of the OLED.

FIG. 15 is a graph illustrating the relationship between a driving current density and the service life of the OLED.

FIG. 15 is a graph illustrating the OLED driven at a current density of 10 mA/cm$^2$, 20 mA/cm$^2$, 50 mA/cm$^2$, and 100 mA/cm$^2$, and measuring a change in the luminance of the OLED with respect to time. The luminance shown in the graph is normalized luminance.

Referring to FIG. 15, in each case, the luminance measured from 1 at time 0 eventually decreased over time. In the case of driving at the current density of 10 mA/cm$^2$, the luminance decreased to 0.5 after about 45 hours, and the luminance exceeding 0.4 was measured even after 50 hours had passed.

In the case of driving at the current density of 20 mA/cm$^2$, the luminance dropped to 0.5 after about 22 hours or service and the luminance further dropped to 0.4 at around 30 to 40 hours.

In the case of driving at the current density of 50 mA/cm$^2$, the luminance dropped at an accelerated rate over time, and the luminance dropped to 0.4 at around 10 hours had elapsed.

In the case of driving at the current density of 100 mA/cm$^2$, the luminance decreased even more sharply over time, and the luminance dropped to 0.4 before the 10-hour mark.

In other words, it can be seen that the service life is shortened as the driving current density of the OLED increases. The driving current density of the light source 110 may be lowered by forming the white pixel electrode 131W according to the embodiment described above to secure an additional light emitting region and compensating for the luminance, and the display panel 110 or the display apparatus 100 may be improved.

Figure 16:
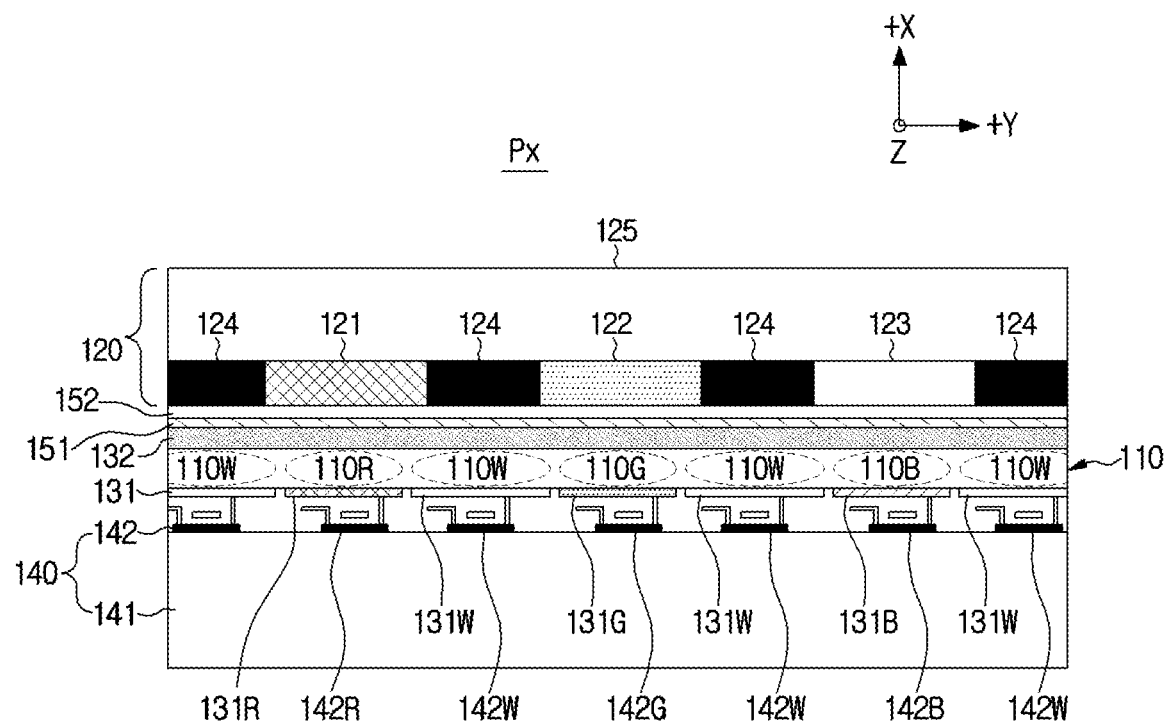
FIGS. 16, 17 and 18 are cross-sectional side views illustrating the structure of the display panel further including additional components.
Figure 17:
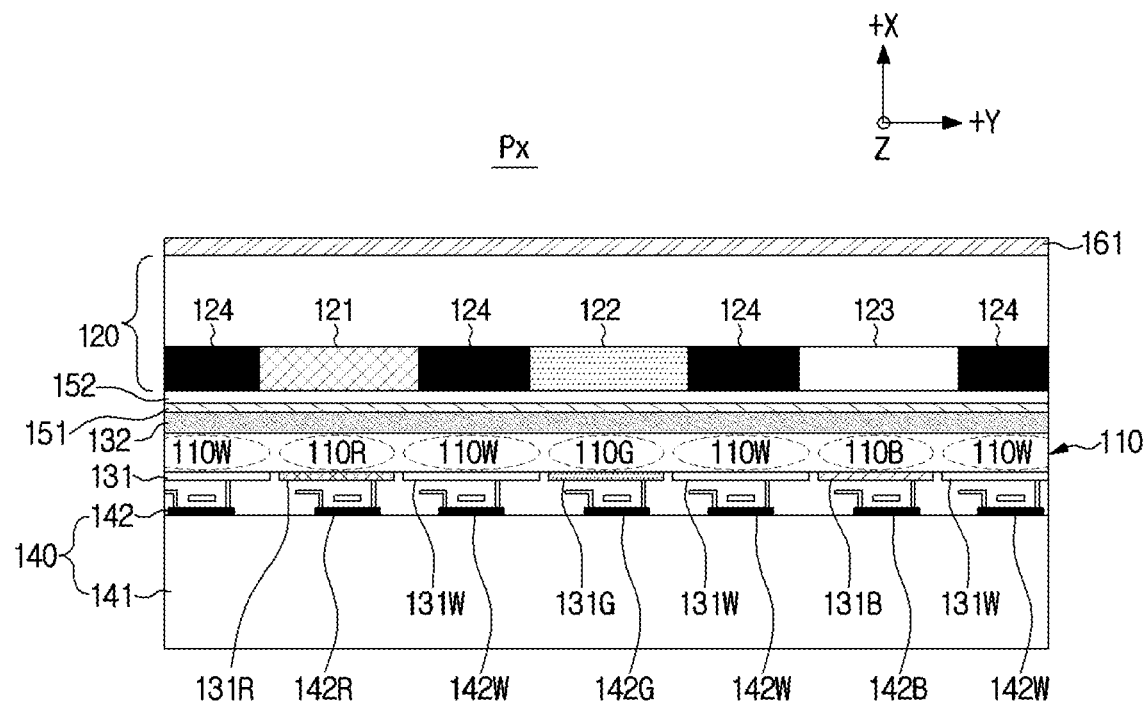
Figure 18:
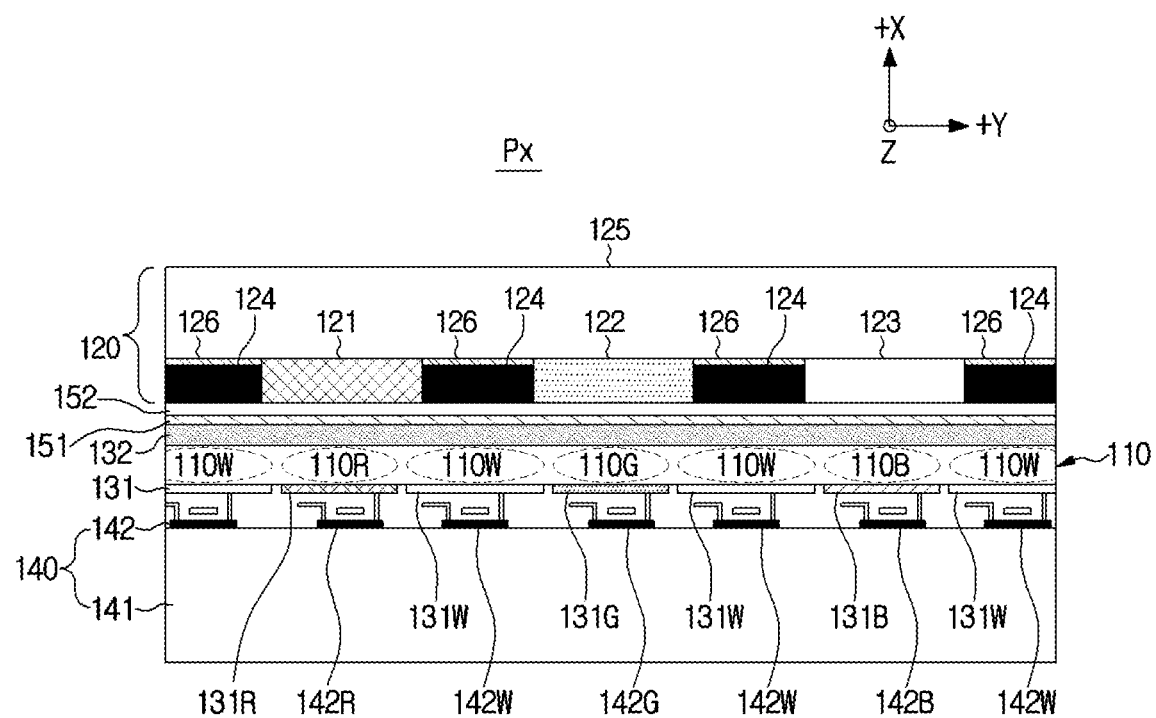

FIGS. 16 to 18 are cross-sectional side views illustrating the structure of the display panel further including additional components.

Referring to FIG. 16, the display panel 100 may further include a smoothing layer 152 which is configured for compensating steps between the members that constitute the quantum dot color filter layer 120. The smoothing layer 152 may be disposed on the rear of the quantum dot color filter layer 120. The smoothing layer 152 may be referred to as an overcoat.

The smoothing layer 152 may be formed of a material selected from a group consisting of a polyacrylates resin, an epoxy resin, a phenolic resin, a polyimide resin, an unsaturated polyesters resin, a polyphenylenethers resin, a polyphenylenesulfides resin and a benzocyclobutene (BCB). However, these materials are only examples to be used in the smoothing layer 152, and the exemplary embodiment of the display panel 100 is not limited thereto.

Once the smoothing layer 152 is formed on the quantum dot color filter layer 120, steps formed between the members that constitute the quantum dot color filter layer 120 may increase the emitting efficiency and may help implement good image quality, even if the surface is not smooth.

In addition, an encapsulation member 151 may be provided in front of the cathode 132 to prevent deterioration of the material from moisture or oxygen. When the encapsulating member 151 is provided, the smoothing layer 152 may be disposed in front of the encapsulating member 151.

The encapsulating member 151 may protect the light source 110 and various circuit elements by sealing them from the outside. The encapsulating member 151 may be a sealant made of various materials such as glass, quartz, ceramic, plastic, and metal.

Referring to FIG. 17, an anti-reflective (AR) layer 161, which is configured for blocking external light reflection, may be disposed in front of the color filter substrate 125. The AR layer 161 may include an AR coating layer or an anti-glare low-reflective coating layer.

For example, the AR layer 161 may include coating layers coated with a material that has a relatively high refractive index and coating layers coated with a material that has a relatively low refractive index, which may alternate with each other in multiple layers.

Low refractive oxides, such as silicon dioxide ($SiO_2$), may be used as the low refractive index material, and at least one of high refractive inorganic oxides, such as titanium dioxide ($TiO_2$), zirconium dioxide ($ZrO_2$), lithium niobate ($LiNbO_3$), lithium tantalate ($LiTaO_3$), lanthanum titanium ($LaTiO_2$), etc., may be used as the high refractive index material.

The coating layer coated with the high refractive index material may have a refractive index that falls within a range of from about 1.70 to about 2.80, or from about 1.90 to about 2.80, and the coating layer coated with the low refractive index material may have a refractive index that falls within a range from about 1.20 to about 1.50.

When the AR layer 161 is formed, image distortion due to the reflection of the external light incident from the outside of the display apparatus 1 may be prevented. In addition, the part of the light that has passed through the color filter substrate 125 and directed to the outside is reflected at the interface between the color filter substrate 125 and the outside air may be reflected to reduce the Fresnel reflection ratio that returns to the inside of the color filter substrate 125 and the light transmission efficiency may be improved by improving the transmission ratio.

Meanwhile, the partition walls 124 partitioning each cell (red light converter, green light converter, and light transmitter) that constitute the quantum dot color filter layer 120 may be implemented in a black color so as to absorb light. For example, the partition walls 124 may be formed of any material such as metals, synthetic resins, synthetic rubbers, or organic materials such as carbon. For example, the partition walls 124 may include chromium (Cr), chromium oxide (CrOx), or a double film containing them. When the partition walls 124 are formed of the materials that absorb light, the movement of light between subpixels is blocked, thereby preventing color mixing and improving the contrast. Also, the external light reflectance may be reduced.

Alternatively, as shown in FIG. 18, it is also possible to form a reflective layer 126 for reflecting light on the entire surface of the partition walls 124 to reduce the external light reflectance. The material of the reflective layer 126 may be at least one selected from a group consisting of $TiO_2$, ZnO, $Fe_2O_3$, CrO, CoO, $SnO_2$, talc, and a reflective material such as kaolin ($Al_2Si_2O_5(OH)_4$), etc. As an example, the reflective layer 126 may be formed by coating the reflective material on the entire surface of the partition walls 124.

When the reflective layer 126 is formed on the entire surface of the partition walls 124, the AR layer 161 disposed in front of the color filter substrate 125 may be omitted.

Figure 19:
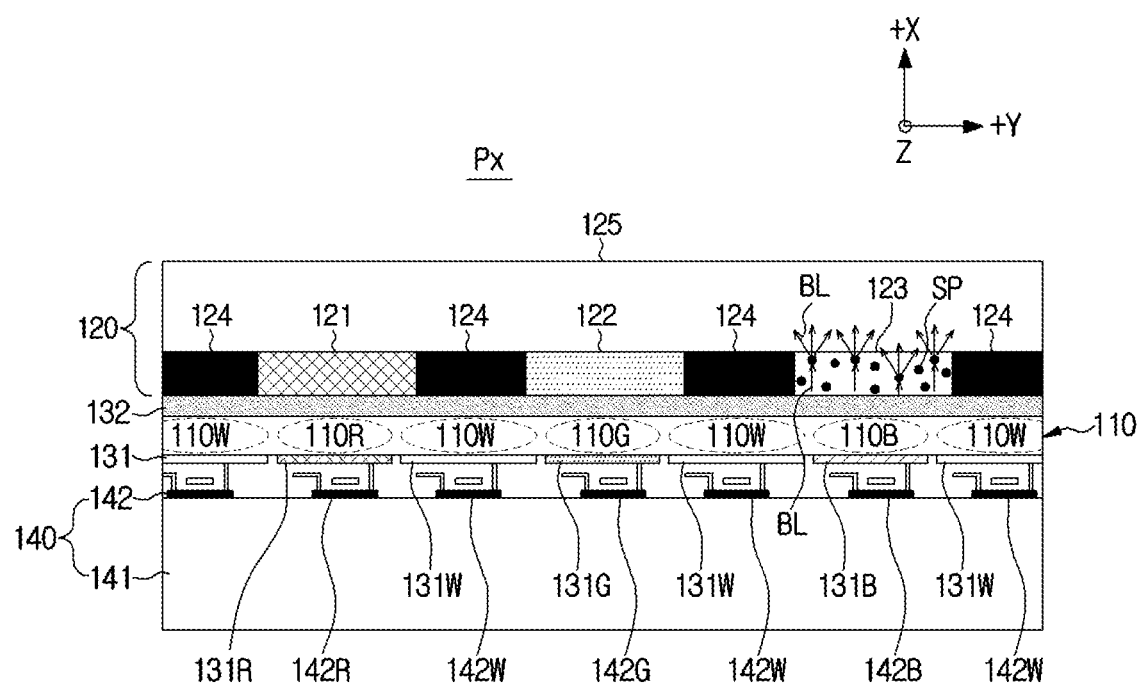
FIGS. 19, 20 and 21 are cross-sectional side views illustrating a configuration of a light transmitter which is included in the display panel according to an embodiment.
Figure 20:
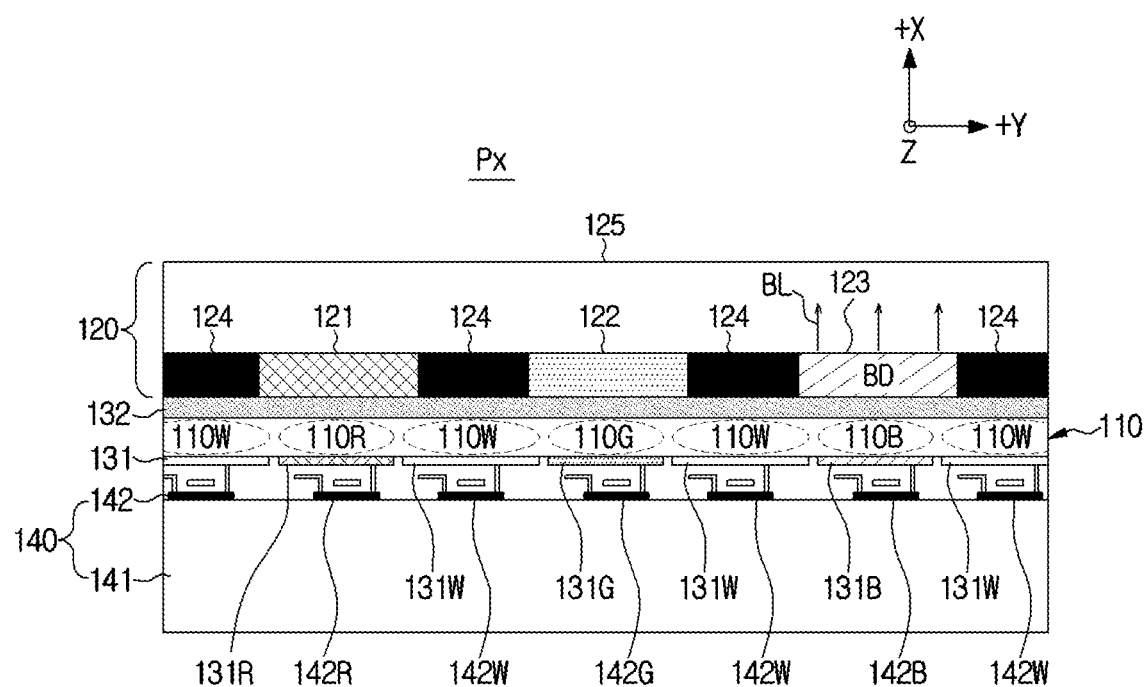
Figure 21:
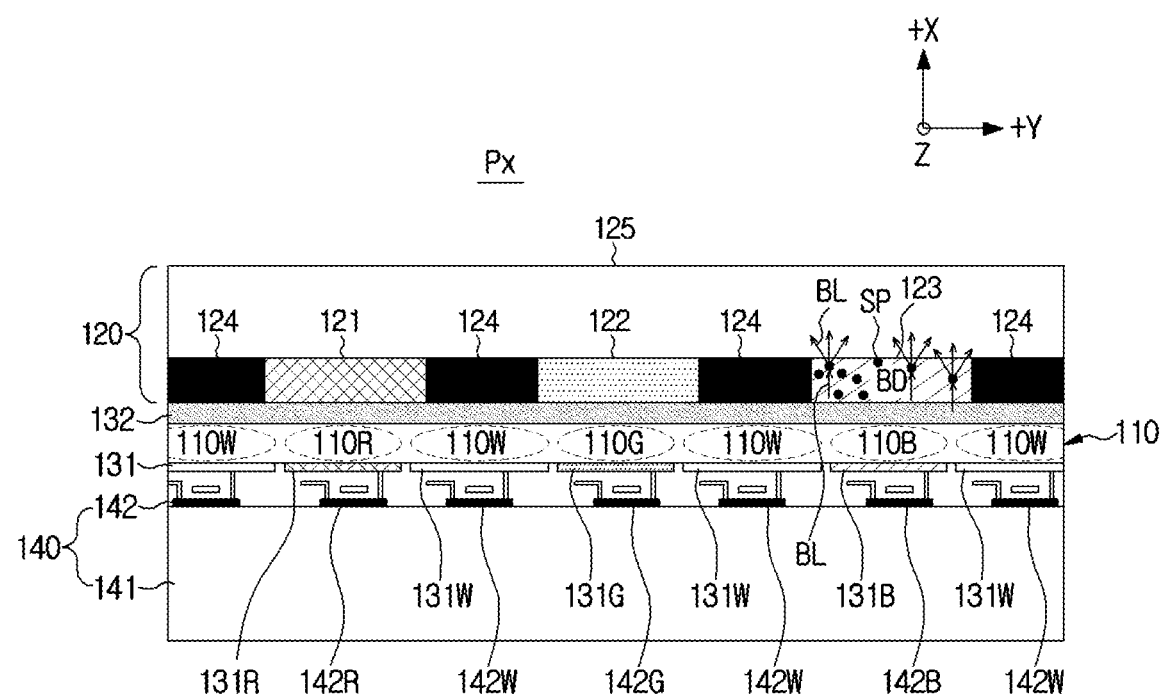

FIGS. 19 to 21 are cross-sectional side views illustrating a configuration of a light transmitter which is included in the display panel according to an embodiment.

Referring to FIG. 19, the light transmitter 123 of the quantum dot color filter layer 120 may further include dispersion particles SP for dispersing the incident light. The dispersion particles SP may be disposed in the light transmitter 123 in a random or predetermined pattern.

The dispersion particles SP may use materials such as zinc oxide, titanium oxide and silicon oxide.

When the dispersion particles SP are included in the light transmitter 123, the light transmission efficiency may be improved by dispersing and emitting incident light such as the red light converter 121 or the green light converter 122.

As shown in FIG. 20, it is also possible that the light transmitter 123 includes a blue dye BD. For example, the blue dye BD may be a dye that transmits blue light and absorbs all light other than the blue light. When the light transmitter 123 includes the blue dye BD, it is possible to reduce artifacts caused by the external light or ambient light incident on the light transmitter 123.

As shown in FIG. 21, the light transmitter 123 may include both the dispersion particles SP and the blue dye BD to improve the light transmission efficiency and reduce the artifacts caused by the external light or the ambient light.

According to the display panel and the display apparatus having the same, the white pixel having excellent uniformity may implemented by further forming the white pixel electrode in addition to the red pixel electrode, the green pixel electrode and the blue pixel electrode in the single pixel region.

Furthermore, as compared with the case of using only the red pixel electrode, the green pixel electrode, and the blue pixel electrode, it is possible to secure a wider light emitting region and improve the luminance.

Further, by reducing the driving current density according to the improvement of the luminance, the service life of the display panel may be improved.

In addition, a space may be efficiently used by forming the red pixel electrode, the green pixel electrode, and the blue pixel electrode and forming the white pixel electrode in the remaining region.

As is apparent from the above description, the display panel and the display apparatus having the same according to the embodiments can secure a wide blue LED emitting region and implement a white screen with excellent uniformity by forming a red subpixel electrode, a green subpixel electrode and a blue subpixel electrode within the single pixel and forming a white pixel electrode in the remaining region, and can improve the service life by reducing the average driving current density.

While embodiments have been described with respect to a limited number of embodiments, those skilled in the art, having the benefit of this disclosure, will appreciate that other embodiments can be devised which do not depart from the scope as disclosed herein. Accordingly, the scope should be limited only by the attached claims.

What is claimed is:

1. A display panel comprising:
   a light source comprising a red subpixel region, a green subpixel region, a blue subpixel region, and at least one white subpixel region, wherein the at least one white subpixel region is configured to emit blue light;
   a red pixel electrode configured to supply a current to the red subpixel region;
   a green pixel electrode configured to supply the current to the green subpixel region;
   a blue pixel electrode configured to supply the current to the blue subpixel region; and
   at least one white pixel electrode disposed in at least one from among between the red pixel electrode and the green pixel electrode and between the green pixel electrode and the blue pixel electrode, the at least one white pixel electrode being configured to supply the current to the at least one white subpixel region.

2. The display panel according to claim 1, further comprising:
   a quantum dot color filter layer comprising a red light converter configured to convert incident light into red light, a green light converter configured to convert incident light into green light, and a light transmitter configured to transmit incident light.

3. The display panel according to claim 1, wherein the red pixel electrode is configured to have a first width smaller than a second width of the red light converter,
   wherein the green pixel electrode is configured to have a third width smaller than a fourth width of the green light converter, and
   wherein the blue pixel electrode is configured to have a fifth width smaller than a sixth width of the light transmitter.

4. The display panel according to claim 3, wherein the at least one white pixel electrode has a seventh width greater than an eighth width of a first interval between the red light converter and the green light converter or a ninth width of a second interval between the green light converter and the light transmitter.

5. The display panel according to claim 2, further comprising:
   at least one partition wall disposed between the red light converter and the green light converter and at least one partition wall disposed between the green light converter and the light transmitter,
   wherein the at least one partition wall disposed between the red light converter and the green light converter and the at least one partition wall disposed between the green light converter and the light transmitter are composed of a black material that absorbs light.

6. The display panel according to claim 5, further comprising:
   a reflective layer disposed on a front surface of the at least one partition wall disposed between the red light converter and the green light converter and the at least one partition wall disposed between the green light converter and the light transmitter and configured to reflect incident light.

7. The display panel according to claim 2, further comprising:
   an anti-reflective layer disposed in front of the quantum dot color filter layer.

8. The display panel according to claim 2, wherein the light transmitter comprises dispersion particles configured to disperse incident light.

9. The display panel according to claim 2, wherein the light transmitter comprises a blue dye.

10. The display panel according to claim 1, wherein the red pixel electrode, the green pixel electrode, and the blue pixel electrode constitute a single pixel, and
    wherein the at least one white pixel electrode is configured to be disposed in a remaining region of the single pixel except for a region in which the red pixel electrode, the green pixel electrode, and the blue pixel electrode are disposed.

11. The display panel according to claim 1, wherein the red subpixel region is configured to emit the blue light, the green subpixel region is configured to emit the blue light, and the blue subpixel region is configured to emit the blue light.

12. A display panel comprising:
    a light source comprising a red subpixel region, a green subpixel region, a blue subpixel region, and at least one white subpixel region;
    a red pixel electrode configured to supply a current to the red subpixel region;
    a green pixel electrode configured to supply the current to the green subpixel region;
    a blue pixel electrode configured to supply the current to the blue subpixel region;
    at least one white pixel electrode disposed in at least one from among between the red pixel electrode and the green pixel electrode and between the green pixel electrode and the blue pixel electrode, the at least one white pixel electrode being configured to supply the current to the at least one white subpixel region; and
    a quantum dot color filter layer comprising a red light converter configured to convert incident light into red light, a green light converter configured to convert incident light into green light, and a light transmitter configured to transmit incident light,
    wherein the red subpixel region is configured to emit blue light toward the red light converter, the green subpixel region is configured to emit the blue light toward the green light converter, and the blue subpixel region is configured to emit the blue light toward the light transmitter.

13. The display panel according to claim 12, wherein the at least one white subpixel region is configured to emit blue light incident on at least one from among the red light converter, the green light converter, and the light transmitter.

14. A display apparatus comprising:
    a light source comprising a red subpixel region, a green subpixel region, a blue subpixel region, and a white subpixel region, wherein the white subpixel region is configured to emit blue light;

a red pixel electrode configured to supply a current to the red subpixel region;

a green pixel electrode configured to supply the current to the green subpixel region;

a blue pixel electrode configured to supply the current to the blue subpixel region;

at least one white pixel electrode disposed in at least one from among between the red pixel electrode and the green pixel electrode and between the green pixel electrode and the blue pixel electrode, the at least one white pixel electrode being configured to supply the current to the white subpixel region;

a thin-firm-transistor (TFT) array comprising a red TFT connected to the red pixel electrode, a green TFT connected to the green pixel electrode, a blue TFT connected to the blue pixel electrode, and at least one white TFT connected to the at least one white pixel electrode; and a controller configured to turn on the red TFT, the green TFT, the blue TFT, and the at least one white TFT to output white light.

15. The display apparatus according to claim 14, further comprising:

a quantum dot color filter layer comprising a red light converter configured to convert incident light into red light, a green light converter configured to convert incident light into green light, and a light transmitter configured to transmit incident light.

16. The display apparatus according to claim 15, wherein the red subpixel region is configured to emit blue light toward the red light converter, the green subpixel region is configured to emit the blue light toward the green light converter, and the blue subpixel region is configured to emit the blue light toward the light transmitter.

17. The display apparatus according to claim 16, wherein the white subpixel region is configured to emit blue light incident on at least one from among the red light converter, the green light converter, and the light transmitter.

18. The display apparatus according to claim 15, wherein the red pixel electrode is configured to have a first width smaller than a second width of the red light converter, wherein the green pixel electrode is configured to have a third width smaller than a fourth width of the green light converter, and wherein the blue pixel electrode is configured to have a fifth width smaller than a sixth width of the light transmitter.

19. The display apparatus according to claim 15, wherein the at least one white pixel electrode has a seventh width greater than an eighth width of a first interval between the red light converter and the green light converter or a ninth width of a second interval between the green light converter and the light transmitter.

20. The display apparatus according to claim 14, wherein the red pixel electrode, the green pixel electrode, and the blue pixel electrode constitute a single pixel, and wherein the at least one white pixel electrode is configured to be disposed in a remaining region of the single pixel except for a region in which the red pixel electrode, the green pixel electrode, and the green pixel electrode are disposed.

* * * * *